(12) United States Patent
Fischer et al.

(10) Patent No.: US 10,913,064 B2
(45) Date of Patent: Feb. 9, 2021

(54) DROPLET ACTUATOR FABRICATION APPARATUS, SYSTEMS, AND RELATED METHODS

(71) Applicant: Abbott Laboratories, Abbott Park, IL (US)

(72) Inventors: Andrew Fischer, Euless, TX (US); Adrian Petyt, Chipping Norton (GB); Sophie Laurenson, Basel (CH)

(73) Assignee: Abbott Laboratories, Abbott Park, IL (US)

( * ) Notice: Subject to any disclaimer, the term of this patent is extended or adjusted under 35 U.S.C. 154(b) by 537 days.

(21) Appl. No.: 14/687,398

(22) Filed: Apr. 15, 2015

(65) Prior Publication Data
US 2015/0298124 A1 Oct. 22, 2015

Related U.S. Application Data

(60) Provisional application No. 61/980,422, filed on Apr. 16, 2014.

(51) Int. Cl.
*B01L 3/00* (2006.01)
*G01N 27/447* (2006.01)
(Continued)

(52) U.S. Cl.
CPC ..... *B01L 3/50273* (2013.01); *B01L 3/502738* (2013.01); *B41J 2/06* (2013.01);
(Continued)

(58) Field of Classification Search
CPC ......... G01N 27/3272; G01N 27/44743; G01N 2001/045; G01N 13/00; G01N 2013/00;
(Continued)

(56) References Cited

U.S. PATENT DOCUMENTS

| 5,104,480 | A | * | 4/1992 | Wojnarowski | ....... | H01C 17/242 |
| | | | | | | 216/65 |
| 5,512,489 | A | | 4/1996 | Girault et al. | | |

(Continued)

FOREIGN PATENT DOCUMENTS

| CN | 1335530 | 2/2002 |
| CN | 1647596 | 7/2005 |

(Continued)

OTHER PUBLICATIONS

International Searching Authority, "Invitation to Pay Additional Fees and Where Applicable, Protest Fee," issued in connection with international application No. PCT/US2015/025901 dated Jul. 24, 2015, 6 pages.

(Continued)

*Primary Examiner* — Gurpreet Kaur
(74) *Attorney, Agent, or Firm* — Hanley, Flight and Zimmerman, LLC

(57) ABSTRACT

Example methods, apparatus, systems for droplet actuator fabrication are disclosed. An example method disclosed herein for making a droplet actuator includes ablating a first substrate with a laser to form an electrode array on the first substrate. The example method includes applying at least one of hydrophobic or a dielectric material to the electrode array. The example method also includes aligning the first substrate with a second substrate. The second substrate includes a second treated layer. In the example method, the alignment includes a gap between at least a portion of the first treated layer and at least a portion the second treated layer.

16 Claims, 9 Drawing Sheets

(51) Int. Cl.
*B41J 2/06* (2006.01)
*H05K 1/02* (2006.01)
H05K 3/02 (2006.01)
H05K 3/00 (2006.01)
H05K 3/38 (2006.01)

(52) U.S. Cl.
CPC ..... *G01N 27/44743* (2013.01); *H05K 1/0272* (2013.01); *B01L 2400/0424* (2013.01); *B01L 2400/0427* (2013.01); *H05K 1/0269* (2013.01); *H05K 3/0097* (2013.01); *H05K 3/027* (2013.01); *H05K 3/388* (2013.01); *H05K 2201/09918* (2013.01); *H05K 2203/1173* (2013.01); *H05K 2203/1545* (2013.01)

(58) Field of Classification Search
CPC .............. H05K 1/0272; H05K 1/0269; H05K 2203/1545; H05K 2203/1173; H05K 3/0097; H05K 3/027; H05K 3/388; B01L 2400/0427; B01L 3/502; G02B 26/0055
See application file for complete search history.

(56) References Cited

U.S. PATENT DOCUMENTS

| | | | |
|---|---|---|---|
| 5,575,930 | A | 11/1996 | Tietje-Girault et al. |
| 6,662,439 | B1 | 12/2003 | Bhullar |
| 6,764,581 | B1* | 7/2004 | Forrow .............. G01N 27/3272 204/403.04 |
| 6,803,019 | B1 | 10/2004 | Bjornson et al. |
| 6,911,132 | B2* | 6/2005 | Pamula ............... B01F 11/0071 204/600 |
| 7,147,763 | B2* | 12/2006 | Elrod .................... B01F 5/0085 204/547 |
| 8,088,578 | B2 | 1/2012 | Hua et al. |
| 8,178,028 | B2 | 5/2012 | Gandhi |
| 8,448,530 | B2 | 5/2013 | Leuenberger et al. |
| 8,696,917 | B2 | 4/2014 | Petisce et al. |
| 8,974,652 | B2* | 3/2015 | Gascoyne ........... B01L 3/50273 204/547 |
| 2002/0027634 | A1 | 3/2002 | Kang et al. |
| 2004/0031688 | A1 | 2/2004 | Shenderov |
| 2005/0103624 | A1 | 5/2005 | Bhullar et al. |
| 2005/0106507 | A1 | 5/2005 | Bernds et al. |
| 2006/0280912 | A1 | 12/2006 | Liang et al. |
| 2008/0128397 | A1 | 6/2008 | Gandhi |
| 2008/0142376 | A1 | 6/2008 | Fouillet et al. |
| 2009/0053859 | A1 | 2/2009 | Xu et al. |
| 2010/0101700 | A1 | 4/2010 | Liang et al. |
| 2010/0200538 | A1 | 8/2010 | Petisce et al. |
| 2011/0266151 | A1 | 11/2011 | Jansson |
| 2012/0044299 | A1 | 2/2012 | Winger |
| 2012/0051972 | A1* | 3/2012 | Joseph .................... C23C 18/31 422/68.1 |
| 2013/0018611 | A1 | 1/2013 | Sturmer |
| 2013/0206597 | A1* | 8/2013 | Wang .................. B41J 2/14024 204/450 |
| 2013/0313130 | A1* | 11/2013 | Little ................. A61B 5/14865 205/792 |
| 2014/0083747 | A1 | 3/2014 | Matsuno et al. |
| 2014/0166612 | A1 | 6/2014 | Petisce et al. |
| 2015/0107998 | A1* | 4/2015 | Fobel .............. G01N 27/44791 204/601 |

FOREIGN PATENT DOCUMENTS

| | | |
|---|---|---|
| CN | 103052735 | 4/2013 |
| CN | 103707643 | 4/2014 |
| EP | 0480703 | 3/1997 |
| EP | 1487605 | 12/2007 |
| JP | 2003101115 | 4/2003 |
| JP | 2006-294454 | 10/2006 |
| JP | 2007132749 | 5/2007 |
| JP | 2008525778 | 7/2008 |
| JP | 2012-517597 | 8/2012 |
| WO | 03088724 | 10/2003 |
| WO | 2006070162 | 7/2006 |
| WO | 2010091334 | 8/2010 |
| WO | 2011002957 | 1/2011 |
| WO | 2012012090 | 1/2012 |
| WO | 2014004908 | 1/2014 |

OTHER PUBLICATIONS

Frank Rüdiger Wagner, "Scanning Excimer Laser Ablation of Poly(Ethylene Terephthalate) (PET) and its Application to Rapid Prototyping of Channels for Microfluidics,", Thesis, Ecole Polytechnique Federale de Lausanne, 2000, 149 pages (with English translsation).
Christopher Walker, "Fabrication of Microfluidic Structures by Laser Ablation and Automation of Optical Testing," Thesis, California Institute of Technology, Pasadena, California, 2010,119 pages.
International Bureau, "Notification of Transmittal of the International Search Report and the Written Opinion of the International Searching Authority," issued in connection with application No. PCT/US2015/025901, dated Oct. 6, 2015, 13 pages.
L. Hu et al., "Flash Dry Deposition of Nanoscale Material Thin Films," Journal of Materials Chemistry, 19(32), (2009), pp. 5845-5849, Abstract provided, 3 pages.
Andriy Bitman et al., "Production Considerations for Bistable Droplet Driven Electrowetting Displays," SID Symposium Digest of Technical Papers, 43(1), (Jun. 2012), pp. 846-849, Abstract provided, 2 pages.
Janglin Chen et al., Technology Advances in Flexible Displays and Substrates,: IEEE Access, 1 (2013), pp. 150-158, 9 pages.
Andrei Kasbashin et al., "Laser Ablation-Based Nanofabrication in Aqueous Solutions," Materials Research Society Proceedings, 850 (2004), Abstract provided, 1 page.
Cheng-Yao Lo, "Novel Roll-to-Roll Lift-Off Patterned Active Matrix Display on Flexible Polymer Substrate," Microelectronic Engineering, vol. 86(4-6) (Apr.-Jun. 2009), pp. 979-983, Abstract provided, 1 page.
Sang-Yub Le et al., "Audible OLED Device on Flexible PVDF Substrate with Laser Patterned ITO Electrode," 2008 SID International Symposium, 39(3), (2008), Abstract provided, 1 page.
Cheng-Yao Lo et al., "Micro Roll-to-Roll Patterning Process and Its Application on Flexible Display," Japanese Journal of Applied Physics, 48(6S), (2009), Abstract provided, 2 pages.
Hao Gu et al., "A Hybrid Microfludic Chip with Electrowetting Functionality Using Ultraviolet (UV)-Curable Polymer," Lab on a Chip, 10, (2010), pp. 1150-1156, 7 pages.
Hong-Ying Zhai, "Pulsed Electron Deposition for Coated Conductor Applications," Frontiers in Superconducting Materials: New Materials and Applications, 2003 Materials Research Society Meeting, EXS(3) (2004), Abstract provided, 1 page.
L. Herbst et al., High Power Excimer Laser Micromachining, Proceedings of the SPIE, 6106, (2006), Abstract provided, 1 page.
International Searching Authority, "International Preliminary Report on Patentability and Written Opinion," issued in connection with application No. PCT/US2015/025901, dated Oct. 18, 2016, 8 pages.
State Intellectual Property Office of China, "First Office Action," issued in connection with Chinese patent application No. 201580032145, dated Jun. 23, 2017, 19 pages (Includes English translation).
Japanese Patent Office, "Notice of Rejection," issued in connection with Japanese Patent Application No. 2016-562862, dated Jan. 9, 2018, 7 pages (includes English translation).
State Intellectual Property Office of China, "Notification of Grant Patent Right for Invention," issued in connection with Chinese Patent Application No. 201580032145.2, dated Jan. 25, 2018, 5 pages (includes English translation).
European Patent Office, "Communication pursuant to Article 94(3) EPC," issued in connection with Application No. 15 719 095.0, dated Jul. 5, 2018, 4 pages.
The State Intellectual Property Office of People's Republic of China, "First Office Action," issued in connection with Chinese Application No. 201810310883.4, dated May 29, 2019, 10 pages. (English translation included.).

(56) References Cited

OTHER PUBLICATIONS

Japanese Patent Office, "Notice of Rejection," issued in connection with Japanese Application No. 2018-244375, dated Dec. 17, 2019, 11 pages (includes English translation).
National Intellectual Property Administration, P.R. China, "Notification to Grant Patent Right for Invention," issued in connection with Chinese Application No. 201810310883.4 dated Jan. 2, 2020, 6 pages (includes English translation).
European Patent Office. "Communication Pursuant to Article 94(3)," issued in connection with European Application No. 15719095.0 dated Nov. 14, 2019, 4 pages.
Japanese Patent Office, "Notice of Rejection," issued in connection with Japanese Patent Application No. 2018-244375, dated Apr. 14, 2020, 4 pages (includes English translation).
European Patent Office, "Communication pursuant to Article 94(3) EPC," issued in connection with European Application No. 15719095.0, dated Mar. 11, 2019, 4 pages.
Japanese Patent Office, "Decision to Grant," issued in connection with Japanese Patent Application No. 2018-244375, dated Oct. 13, 2020, 5 pages (includes English translation).
European Patent Office, "Communication pursuant to Article 94(3) EPC," issued in connection with European Patent Application No. 15719095.0, dated Jul. 7, 2020, 3 pages.

\* cited by examiner

DROPLET ACTUATOR FABRICATION APPARATUS, SYSTEMS, AND RELATED METHODS

RELATED APPLICATIONS

This patent claims the benefit under 35 U.S.C. § 119(e) to U.S. Provisional Patent Application No. 61/980,422, filed Apr. 16, 2014, which is incorporated hereby incorporated by reference in its entirety.

FIELD OF THE DISCLOSURE

This disclosure relates generally to electrode arrays, and, more particularly, to droplet actuator fabrication apparatus, systems, and related methods.

BACKGROUND

Droplet actuators are used in a variety of microfluidic operations for manipulating and analyzing discrete volumes of fluid. Droplet actuators include two plates separated by a gap, with at least one of the plates containing an array of electrodes coated with a hydrophobic and/or dielectric material. Fabricating drop actuators involves creating the electrode array, which can require high production costs in terms of time and pricing to define the electrode array without sacrificing technical performance qualities of the electrodes of the array.

Figure 1:
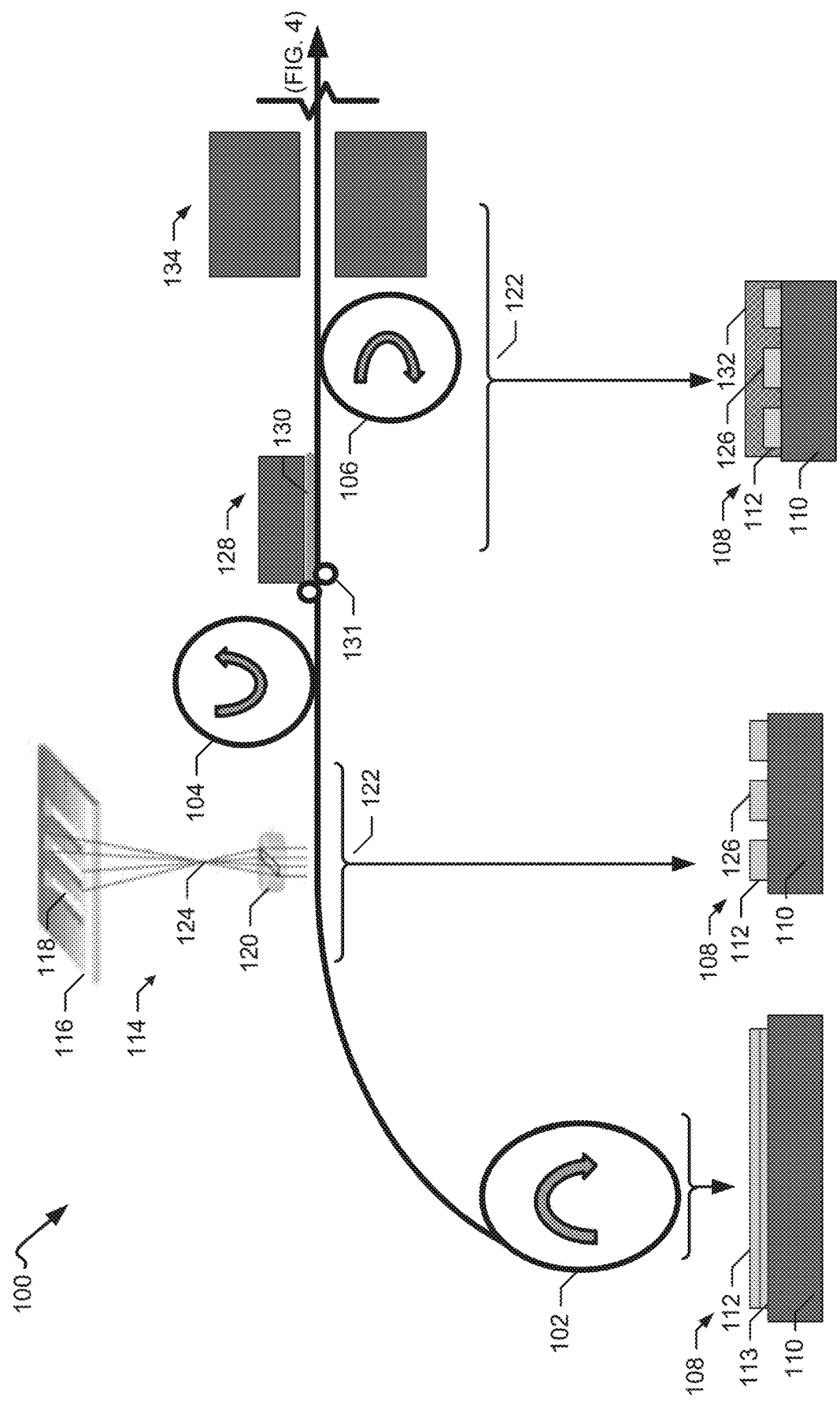
FIG. 1 is a diagram of a first example assembly for creating a base substrate of an example droplet actuator.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Methods, systems, and apparatus involving fabrication of droplet actuators are disclosed herein. Droplet actuators are used in microfluidic analysis, and, in particular, are used in the field of droplet-based, or digital, microfluidics. Droplet actuators include two surfaces separated by a gap. At least one of the surfaces includes an electrode array that is coated or insulated by a hydrophobic material or a dielectric. A droplet disposed in the gap can be manipulated on the surface of the hydrophobic and/or dielectric material by selectively applying electrical potentials to electrodes of the electrode array to affect the wetting properties of the hydrophobic and/or dielectric surface pursuant to, for example, electrowetting or dielectrophoresis processes. Droplets disposed in the gap can include biological fluid samples such as, for example, blood, plasma, serum, saliva, sweat, etc. Electrical potentials may be used to transfer droplets between adjacent electrodes of the array, and/or to merge or split droplets as part of a variety of analyses, including for example, DNA sequencing and protein analysis.

Fabricating the example droplet actuators disclosed herein includes creating an electrode pattern that includes an electrode array on a base surface and coating the surface with at least one layer of a material exhibiting hydrophobic and/or dielectric properties. Producing the example droplet actuators also includes creating a top substrate, which may include a conductive surface coated with a material having hydrophobic and/or dielectric qualities and joining (e.g., bonding) the top substrate and the bottom substrate at a spaced apart distance to accommodate a droplet. The pattern of the electrode array that is created on at least the base substrate is based on design qualities of the electrodes that affect performance of the droplet actuator, such as, for example, electrical conductivity and electrode spacing. Increasing the number of electrodes per an area of the substrate provides for accommodation of differently sized electrodes and greater inter-digitation of the electrodes in the array. Higher resolution of the electrode array results in increased precision of the sizes of the droplets that are actuated by the droplet actuator and facilitates ease of transfer of the droplets between electrodes.

Known methods and systems for fabricating droplet actuators require a compromise between production efficiencies and quality of the electrode array. For example, lithographic methods provide for high spatial resolution in defining electrode arrays, but involve slow production times and expensive methodology. For example, lithographic methods involve depositing a photoresist on a substrate to engrave patterns in the substrate via chemical treatments. Depositing the photoresist must be repeated across the substrate to form individual electrode arrays, which increases production times. Also, droplet actuators formed using lithographic methods require post-processing steps such as cleaning the droplet actuators to remove the photoresist from the substrate. However, traces of chemicals can remain on the substrate after rinsing and can result in water marks on the substrate. Further, although lithographic methods can provide for high spatial resolution of an electrode array, the quality of the lines and gaps of the resulting electrode array can be poor quality, including rough edges defining the electrode array and random (e.g., non-systematic) defects between droplet actuators due inconsistencies with respect to deposition of the photoresist on the substrate.

Attempts to improve production efficiencies include printing electrodes on printed circuit boards. However, although the use of printed circuit boards may provide for faster production of droplet actuators at reduced material costs as compared to lithographic methods, the spatial resolutions of the arrays are sacrificed, which affects the capabilities of the droplet actuator in generating and manipulating droplets. Droplet actuator fabrication methodologies involving printed circuit boards can also require multiple steps to join or adhere one or more of a supporting surface and/or a hydrophobic surface to the printed circuit board to form the base layer of the droplet actuator.

Disclosed herein are example methods and systems for fabricating droplet actuators using laser ablation as part of a roll-to-roll assembly. Laser ablation can define electrode arrays including a plurality of electrodes at fast production speeds without sacrificing electrode quality by removing materials from a solid substrate via laser beam in a controlled manner. Technical advantages of electrodes produced via laser ablation include increased electrical conductivity as compared to printed electrodes; a low degree of surface roughness; a low degree of roughness associated with the edges defining the electrode features, thereby improving inter-digitization of the electrodes of the array; and a low degree of variation between features of the respective electrodes of the array. Laser ablation can produce an electrode pattern including lines and gaps measuring from, for example, less than 5 µm to about 10 µm. Further, laser ablation does not require the use of solvents that might negatively interfere with the use of the resulting droplet actuators by leaving residues or chemicals that are harmful to the production environment.

The example methods and systems disclosed herein are implemented via a roll-to-roll assembly, which can operate to move a substrate through various stations at high speeds, including, for example, rates of meters per second. Roll-to-roll assemblies facilitate the unwinding of a rolled substrate, the advancement of the substrate through the stations, and the rewinding of the processed substrate into a roll. Thus, a base and/or top substrate of a droplet actuator may be processed through one or more of a laser ablation station, a hydrophobic and/or dielectric printer, and a curing station at a rapid, continuous pace without compromising the technical qualities of the resulting droplet actuator. Further, the disclosed example methods and systems produce a base substrate and/or top substrate that do not require further individual assembly with respect to, for example, the electrode array, the hydrophobic and/or dielectric layer, and/or a supporting structural base, thereby reducing operation time and costs. Thus, examples disclosed herein provide for efficient production of droplet actuators without sacrificing quality of the microfluidic device.

An example method disclosed herein for making a droplet actuator includes ablating a first substrate with a laser to form an electrode array on the first substrate. The example method includes applying at least one of a hydrophobic or a dielectric material to the electrode array to form a first treated layer on the first substrate. The example method also includes aligning the first substrate with a second substrate. The second substrate includes a second treated layer. In the example method, the alignment includes a gap between at least a portion of the first treated layer and at least a portion of the second treated layer.

In some examples, the method includes inserting one or more capillary tubes between the first substrate and the second substrate to create the gap.

In some examples, the method includes curing at least one of the hydrophobic material or the dielectric to form the first treated layer. In some examples, curing the hydrophobic material includes exposing the at least one of the hydrophobic or the dielectric material to at least one of heat or ultraviolet light.

In some examples, ablating the first substrate includes projecting a pattern onto a portion of the first substrate via a lens and focusing the laser on the portion. In such examples, the laser is to penetrate the portion to form the pattern on the portion. Also, in some such examples, the pattern comprises a plurality of lines and gaps, the lines having a width of about 10 micrometers.

Also, in some examples, ablating the first substrate includes exposing a plurality of portions of the first substrate to the laser in succession. In such examples, the laser is to form the electrode array onto each of the plurality of the portions.

In some examples, the method includes coating a first portion of the plurality of portions with the at least one of the hydrophobic or the dielectric material at substantially the same time a second portion of the plurality of portions is exposed to the laser.

In some examples, the first substrate includes at least a first portion and a second portion. Each of the first portion and the second portion comprises a respective electrode array. In such examples, the second substrate includes at least a third portion and a fourth portion. Also, in such examples, aligning the first substrate with the second substrate includes aligning the first portion and the third portion at a first spaced apart distance and the second portion and the fourth portion at a second spaced apart distance. The first spaced apart distance and the second spaced apart distance correspond to the gap. In some examples, the method includes dicing the aligned first substrate and the second substrate, wherein the dicing is based on the alignment of the first portion and the third portion and the second portion and the fourth portion. Also, in some examples, the method includes bonding the first portion the third portion and the second portion and the fourth portion, respectively, with an adhesive material.

Also disclosed herein is an example system including a plurality of rollers to drive a first substrate between a plurality of positions. The example system includes a laser to penetrate the first substrate when the first substrate is in a first position of the plurality of positions. The laser to form at least one electrode pattern on the first substrate. The example system includes a printer to apply at least one of a hydrophobic or a dielectric material to the at least one electrode pattern when the first substrate is in a second position of the plurality of positions. In the example system, the plurality of rollers are to drive the first substrate from the second position to a third position of the plurality of positions. In the third position, the first substrate is to align with a second substrate to form a droplet actuator.

In some examples, the laser is to substantially continuously pulse during operation of the plurality of rollers and the laser is to penetrate one or more portions of the first substrate during the operation of the plurality of rollers.

In some examples, the first substrate comprises a first layer and a second layer. The second layer comprises a conductive material. In some examples, the first substrate includes a third layer disposed between the first layer and the second layer. The third layer is to adhere the second layer to the first layer.

In some examples, the laser is to remove at least a portion of the second layer to form the electrode pattern.

In some examples, the second layer is disposed on the first layer in a first roll. The plurality of rollers are to unwind the first roll to drive the first substrate to the first position. The plurality of rollers are to drive the first substrate to the third position to form a second roll. In such examples, the second layer is disposed on the first layer in the third position.

Some of the disclosed examples include a splitter to cut the second roll to form at least one microfluidic chip.

Also, in some examples, the printer comprises one or more coating rollers to apply the at least one of the hydrophobic or the dielectric material to the at least one electrode pattern. In some examples, the coating rollers are to apply an anti-fouling material to the first substrate.

In some examples, the system further comprises a merger to align the first substrate with the second substrate in the third position. In some examples, the merger comprises two rollers. Also, some of the disclosed examples include a curing station to cure the at least one of the hydrophobic material or the dielectric material. Some of the disclosed examples also include a bonding station to bond at least a first portion of the first substrate with at least a first portion of the second substrate. The bonded portions include the at least one electrode pattern.

Also disclosed herein is an example method including patterning an electrode array on a first sheet using a laser. The example method includes applying at least one of a hydrophobic material or a dielectric to the first sheet to create a first treated layer. The example method includes applying the at least one of the hydrophobic material or the dielectric to a second sheet to create a second treated layer. The example method also includes associating the first sheet and the second sheet at a spaced apart distance. The first treated layer is an insulating layer relative to the electrode array and a droplet received between the first treated layer and the second treated layer.

In some examples, the method includes curing the first treated layer and the second treated layer.

In some examples, associating the first sheet and the second sheet includes orienting the second treated layer in a first orientation, the first orientation opposite a second orientation of the first treated layer and merging the first treated layer and the second treated layer in a substantially parallel configuration. In some examples, merging the first sheet and the second sheet includes applying an adhesive material to at least one of the first sheet or the second sheet and bonding the first sheet with the second sheet. In such examples, the bonding is to preserve the spaced apart distance between the first sheet and the second sheet.

In some examples, the second sheet comprises a substantially single electrode. The second treated layer is to insulate the electrode.

In some examples, the method includes patterning an electrode array on the second sheet. In some examples, the second sheet includes a non-conductive material.

In some examples, the method includes embossing the first sheet to create one or more projections on the first sheet. In such examples, the projections are to separate the first sheet and the second sheet at the spaced apart distance.

Also disclosed herein is an example apparatus including a non-conductive layer and a conductive layer. The conductive layer is adhered to the non-conductive layer. The example apparatus includes an electrode pattern disposed in the conductive layer. The electrode pattern is insulated by at least one of a hydrophobic or a dielectric material. In the example apparatus, at least a portion of the non-conductive layer includes a feature of the electrode pattern.

In some examples, the feature is an outline of at least a portion of the electrode pattern. In some examples, the electrode pattern comprises a line and the feature at least partially corresponds to a position of the line in the electrode pattern. Also, in some examples, the feature is at least one of an indentation or a projection in a surface of the portion of the non-conductive layer.

In some examples, the example apparatus includes an anti-fouling layer disposed on the electrode pattern.

Also disclosed herein is an example substrate web for forming a plurality of droplet actuators therefrom. The substrate web includes a non-conductive layer and a conductive layer coupled to the non-conductive layer. The conductive layer includes a first electrode pattern and a second electrode pattern. The second electrode pattern is spaced apart from the first electrode pattern. The first electrode pattern includes a first marking and the second electrode pattern includes a second marking. The first marking is substantially identical to the second marking. The substrate web also includes at least one of a hydrophobic layer or a dielectric layer disposed over a substantial entirety of the respective first and second electrode patterns.

In some examples, the first marking and the second marking are substantially identical based on at least one of a size or a position of the first and second markings on the respective first and second electrode patterns.

In some examples, the first electrode pattern includes a plurality of lines and gaps. The lines having a width of about 10 micrometers. Also, in some examples, a thickness of the conductive layer is less than about 120 nanometers.

In some examples, the non-conductive layer defines a groove therein. The groove is based on the first electrode pattern.

Some examples of the substrate web include an adhesive layer disposed between the conductive layer and the non-conductive layer to couple the conductive layer to the non-conductive layer.

In some examples, the first electrode pattern includes lines and spacings, and edges of the lines bordering the spacings are substantially smooth. Also, in some examples, the marking is an interruption to a line defining the electrode pattern.

Also disclosed herein is an example apparatus including a first substrate having a plastic layer and a metal layer. The example apparatus also includes an electrode pattern formed in the metal layer. The electrode pattern is insulated by at least one of a hydrophobic or a dielectric material. The electrode pattern includes lines having at least partially curved edges defining spacings between the lines.

In some examples, the example apparatus includes a second substrate aligned with the first substrate, wherein the alignment includes a gap between the first substrate and the second substrate. In some examples, one or more projections are disposed in the gap. In some examples, the projections are capillary tubes. Also, in some examples, the second substrate includes at least one of a hydrophobic or a dielectric material.

In some examples, the plastic layer includes a partially curved groove corresponding to the electrode pattern formed in the metal layer.

Turning now to the figures, FIG. 1 is a diagram of a first example system or assembly 100 for creating a base substrate of a droplet actuator. The first example assembly 100 includes a series or a plurality of rollers, including a first roller 102, a second roller 104, and a third roller 106, which operate in synchronized rotation to drive a base substrate 108 through the first example assembly 100. The first example assembly 100 can include rollers in addition to the first through third rollers 102, 104, 106 to move the base substrate 108 through the assembly using roll-to-roll techniques. Other examples may use conveyors, pulleys and/or any other suitable transport mechanism(s). Prior to cutting or sizing of the base substrate 108 to produce individual droplet actuators, the base substrate 108 can be considered a substrate web that may be in a rolled, partially rolled, or unrolled configuration as the base substrate 108 moves through the first example assembly 100.

In the first example assembly 100, the first roller 102 rotates to unwind the base substrate 108, which, in some examples, is a single sheet in a rolled configuration. The base substrate 108 includes a first layer 110 and a second layer 112. In this example, the first layer 110 comprises a non-conductive flexible substrate, such as for example a plastic, and the second layer 112 includes a conductive material. The conductive material of the second layer 112 can be, for example, a metal such as gold, silver, or copper, or a non-metallic conductor, such as a conductive polymer. In other examples different metal(s) or combination(s) of metal(s) and/or conductive polymer(s) may be used. In some examples, the base substrate 108 includes an adhesive layer 113 disposed between the non-conductive first layer 110 and the conductive second layer 112. As an example, the adhesive layer 113 can comprise chrome, with a layer of gold disposed on top of the chrome adhesive layer 113 to form the conductive second layer 112. Thus, in the base substrate 108 of FIG. 1, the non-conductive first layer 110 and the conductive second layer 112 are pre-adhered to form the base substrate 108 prior to being unwound by the first roller 102.

In the example base substrate 108 of FIG. 1, the non-conductive first layer 110 has a thickness of less than about 500 nm. As will be described below, such a thickness allows for the base substrate 108 to move through the example first assembly 100 via the plurality of rollers. Also, in some examples, the thickness of the non-conductive first layer 110 is greater than a thickness of the conductive second layer 112. As an example, the thickness of the conductive second layer 112 can be approximately 30 nm. In other examples, the thickness of the conductive second layer 112 is less than about 500 nm, and in some examples the thickness of the second layer 112 is less than about 120 nm. In some examples, the thickness of the non-conductive first layer 110 and/or the conductive second layer 112 is selected based on, for example, the materials of the first and/or second layers 110, 112 and/or an operational purpose for which the droplet actuator formed from the base substrate 108 is to be used.

The first roller 102 drives the base substrate 108 to a laser ablation station 114. The laser ablation station 114 includes a mask 116 containing a master pattern 118 that is to be projected onto the conductive second layer 112 of the base substrate 108. The master pattern 118 associated with the mask 116 may be predefined based on characteristics such as resolution (e.g., number of electrodes per an area of the base substrate 108 to be ablated), electrode size, configuration of lines defining the electrode pattern, inter-digitation of the electrodes, and/or gaps or spacing between the electrodes. In some examples, the characteristics of the master pattern 118 are selected based on one or more operational uses of the droplet actuator with which the base substrate 108 is to be associated (e.g., for use with biological and/or chemical assays). Also, in some examples, the master pattern 118 is configurable or reconfigurable to enable the laser ablation station 114 to form different patterns on the base substrate 108. Additionally or alternatively, in some examples the mask 116 is replaceable with one or more alternative masks.

The laser ablation station 114 includes a lens 120. As the base substrate 108 encounters the laser ablation station 114 as a result of the rotation of the rollers (e.g., the first roller 102), a portion 122 of the base substrate 108 passes under or past the lens 120. The portion 122 may be, for example, a rectangular or square section of the base substrate 108 having an area less than the area of the base substrate 108 and including the conductive second layer 112. The lens 120 images or projects at least a portion of the master pattern 118 onto the conductive second layer 112 associated with the portion 122. A laser beam 124 is directed onto the portion 122 via the mask 116 and the lens 120 such that the laser beam 124 selectively penetrates the conductive second layer 112 based on the projected master pattern 118. In some examples, the non-conductive first layer 110 or a portion (e.g., a fraction of the thickness of the non-conductive first layer 110) may also be penetrated by the laser beam 124 based on the projected master pattern 118. The solid portions of the mask 116 block the laser beam 124, and the open portions of the mask 116 allow the laser beam 124 to pass through the mask 116 and into contact with the base substrate 108. The laser beam 124 can be associated with, for example, an excimer laser.

As a result of exposure to the laser beam 124, the irradiated non-conductive first layer 110 of the portion 122 absorbs energy associated with the laser beam 124. The irradiated non-conductive first layer 110 undergoes photochemical dissociation, resulting in a selective breaking up of the structural bonds of non-conductive first layer 110 and ejection of fragments of the non-conductive first layer 110 and portions of the conductive second layer 112 overlaying the irradiated non-conductive first layer 110 in accordance with the master pattern 118 to form an electrode array 126 on the conductive second layer 112. Thus, the ejection of fragments of the non-conductive first layer 110 as a result of penetration of the laser beam 124 in the non-conductive first layer 110 during formation of the electrode array 126 can result in structural changes to the non-conductive first layer 110. Such structural changes may alter the appearance of the non-conductive first layer 110.

As disclosed above, the laser beam 124 selectively penetrates the non-conductive first layer 110 and the conductive second layer 112 in accordance with the master pattern 118 mask 116. Thus, the portions or fragments of the non-conductive first layer 110 that are ejected are based on the master pattern 118 such that after the fragmentation of the non-conductive first layer 110, the non-conductive first layer 110 includes a feature of the master pattern 118 corresponding to the electrode array 126. The feature or marking in the non-conductive first layer 110 can include, for example, an outline or a substantial outline of at least a portion of the master pattern 118. In some examples, the non-conductive first layer 110 includes a disturbance (e.g., a burn mark) formed as a result of the penetration of the laser beam 124 into the non-conductive first layer 110. The disturbance can include, for example, a change in the thickness of at least some portion of the non-conductive first layer 110, an indentation (e.g., a groove) in a portion of the non-conductive first layer 110, or a projection in a surface of the non-conductive first layer 110 (e.g., as a result of the breaking up and fragmentation of the non-conductive first layer 110). The indentations can include angled or sloped portions forming walls in the non-conductive first layer 110.

Thus, as result of the concurrent exposure of the non-conductive first layer 110 and the conductive second layer 112 to the laser beam 124, the non-conductive first layer 110 can undergo one or more structural changes that may be reflected in grooves, projections, markings, discolorations, etc., as will be further disclosed below in connection with FIG. 2E.

In some examples, a depth (e.g., a radiation intensity) to which the laser beam 124 penetrates the base substrate 108 is predefined based on a depth (e.g., a thickness) of the non-conductive first layer 110 and/or the conductive second layer 112. In some examples, the laser beam 124 penetration depth is adjustable to change the depth at which the laser beam 124 ablates the conductive second layer 112 as a result of the fragmentation of the underlying non-conductive first layer 110. In some examples, this adjustment is dynamic as the example system 100 operates. Also, in some examples, the base substrate 108 undergoes cleaning after exposure to the laser beam 124 to remove particles and/or surface contaminants.

Figure 2A:
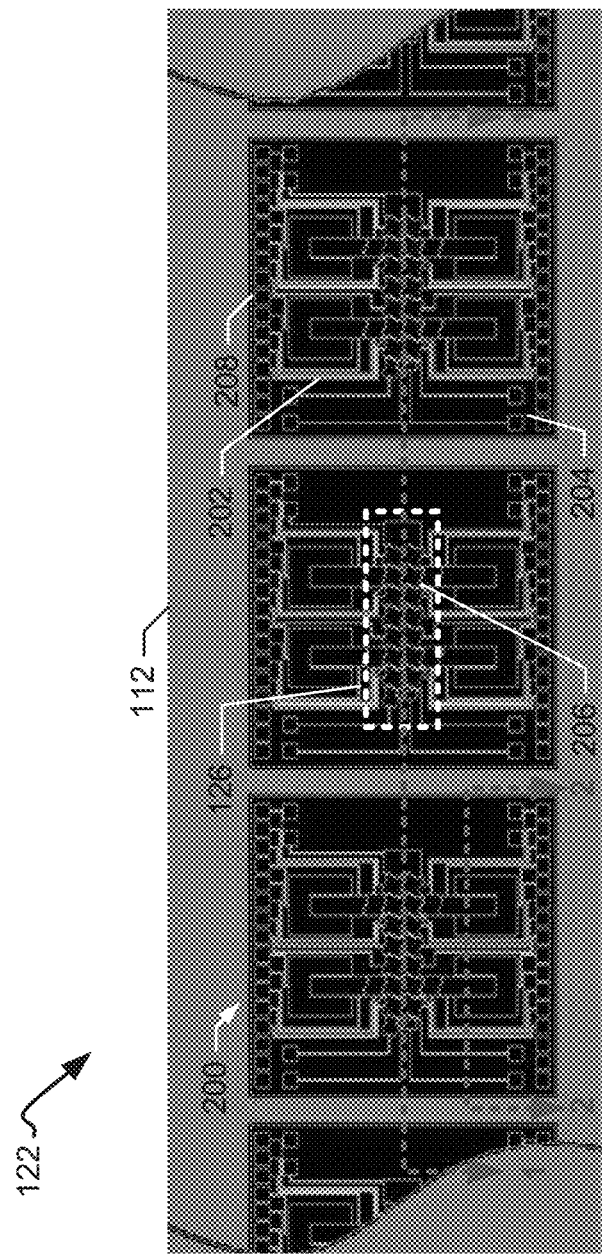
FIG. 2A is a top view of an example electrode pattern on the example base substrate created via the first example assembly of FIG. 1.

As illustrated in FIG. 1, after exposure to the laser ablation station 114, the portion 122 of the base substrate 108 includes the electrode array 126. The electrode array 126 is made up of a plurality of electrodes formed into the conductive second layer 112 (FIG. 2A). As a result of the exposure to the laser beam 124 and fragmentation of the non-conductive first layer 110, portions of the conductive second layer 112 are removed from the base substrate 108. The removed portions associated with the electrode array 126 are based on the master pattern 118. In some examples, the removed portions match the open portions of the mask 116.

For example, FIG. 2A illustrates a top view of the portion 122 of the base substrate 108 after exposure to the laser ablation station 114 of the first example assembly 100 of FIG. 1. As show in FIG. 2A, exposure to the laser beam 124 results in the formation of a laser-ablated electrode pattern 200 on the conductive second layer 112. The laser-ablated electrode pattern 200 includes lines 202 and spacings 204, which correspond to the master pattern 118 projected onto the portion 122 via the lens 120 of FIG. 1.

In the example electrode pattern 200, the lines 202 and the spacings 204 define one or more array electrodes 206 that form the electrode array 126. The example electrode pattern 200 also includes one or more non-array electrodes 208. The non-array electrodes 208 that are not a part of the electrode array 126 facilitate external electrical connections during operation of the droplet actuation. The array electrodes 206 and the non-array electrodes 208 of the electrode pattern 200 can vary in size and/or shape. For example, the non-array electrodes 208 can be substantially square-shaped whereas the array electrodes 206 can be in a configuration other than a square. The shapes and/or sizes of the electrodes 206, 208 of the electrode pattern 200 are defined by the lines 202 and the spacings 204 in association with the master pattern 118 projected onto the base substrate 108. As a result of formation via laser ablation, the lines 202 defining the electrodes 206, 208 are substantially smooth and/or have substantially reduced roughness with respect to the definition of the edges of the electrodes 206, 208 as compared to, for example, other methods for forming electrode arrays such as photolithography or printed circuit board methods.

In some examples, the lines 202 and/or the spacings 204 formed via laser ablation measure (e.g., have a width of) approximately 10 μm; in other examples, the lines 202 and/or the spacings 204 are greater or less than 10 μm (e.g., about 5 μm). The arrangement and sizes of the lines 202 and/or the spacings 204 define a resolution of the electrode array 126. For example, minimal spacings 204 between the lines 202 allows for a greater number of array electrodes 206 in close proximity (e.g., inter-digitization of the array electrodes 206) within the electrode array 126 and, as will be disclosed below, reduces an amount of dielectric and/or hydrophobic material applied between adjacent electrodes. Thus, the features of the laser ablated electrode pattern 200 maximize a surface area of the portion 122 that contributes to operation of the resulting droplet actuator, thereby reducing an amount of materials necessary to form individual droplet actuators. Further, increased inter-digitation of the array electrodes 206 facilitates an ease with which droplets are actuated on the base substrate 108 via manipulation of electrical potentials. Increased resolution of the electrode array 126 also improves a precision of droplet sizes that are actuated.

Figure 2B:
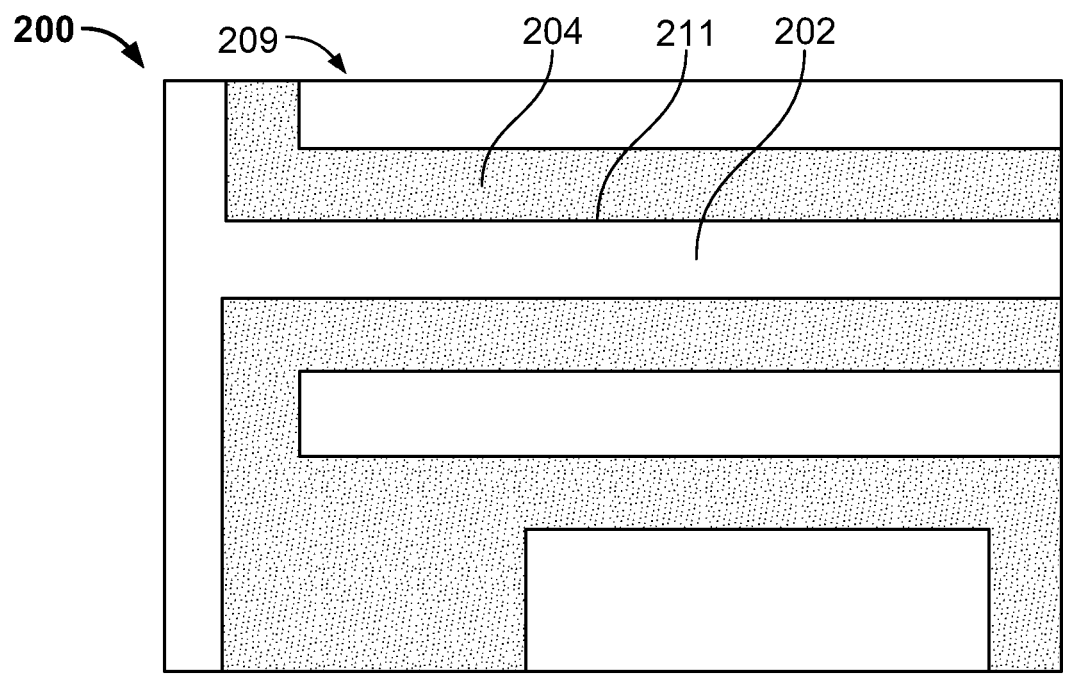
FIG. 2B is a top view of a portion of the example electrode pattern of FIG. 2A created via broad field laser ablation.

Laser ablation of the portion 122 of the base substrate or web 108 at the laser ablation station 114 may be achieved via broad field ablation or via rastering. Broad field ablation involves exposure of the laser beam 124 over substantially the entire portion 122. The master pattern 118 is created on the portion 122 by removing material from the conductive second layer 112 with a substantially single instance of exposure of the non-conductive first layer 110 and the conductive second layer 112 to the laser beam 124 (e.g., a single flash of the laser beam 124). In broad field laser ablation, the master pattern 118 is thus simultaneously created across the area of the conductive second layer 112 associated with the portion 122 to ablate the base substrate 108 at high speeds. FIG. 2B is a top view of a portion 209 of the electrode pattern 200 of FIG. 2A created via broad field ablation based on the master pattern 118. As shown in FIG. 2B, the portion 209 includes the lines 202 and the spacings 204 defining the electrode pattern 200. The lines 202 and/or spacings 204 can have widths of less than 10 μm. As also shown in FIG. 2B, edges 211 of the lines 202 are substantially smooth and without substantial rough, sharp, pointed, or uneven portions. Such smooth and defined edges 211 result from the irradiation of the base substrate 108 by the laser beam 124 to create the master pattern 118 with a single exposure of the laser beam 124 on the portion 122.

Alternatively, laser ablation can be achieved via rastering or scribing, in which the laser beam 124 iteratively etches the master pattern 118 into the portion 122 to form the electrode pattern 200, including the electrode array 126, in the conductive second layer 112 as the base substrate 108 and/or the laser beam 124 moves. In examples where rastering techniques are used, the electrode pattern 200 is determined digitally without the use of the mask 116. For example, to iteratively etch the master pattern 118 into the portion 122, the laser beam 124 moves along the base substrate 108 to inscribe the master pattern 118 into the conductive second layer 112 via a series of individual pulses in adjacency. The individual pulses result in lines 202 having widths between, for example, 30 and 200 μm. In examples where the rastering is used to form the electrode pattern 200, the edges of the array electrodes 206 may be less smooth due to pulse markings formed by the individual laser pulses iteratively penetrating the conductive second layer 112, as compared to broad field laser ablation.

Figure 2C:
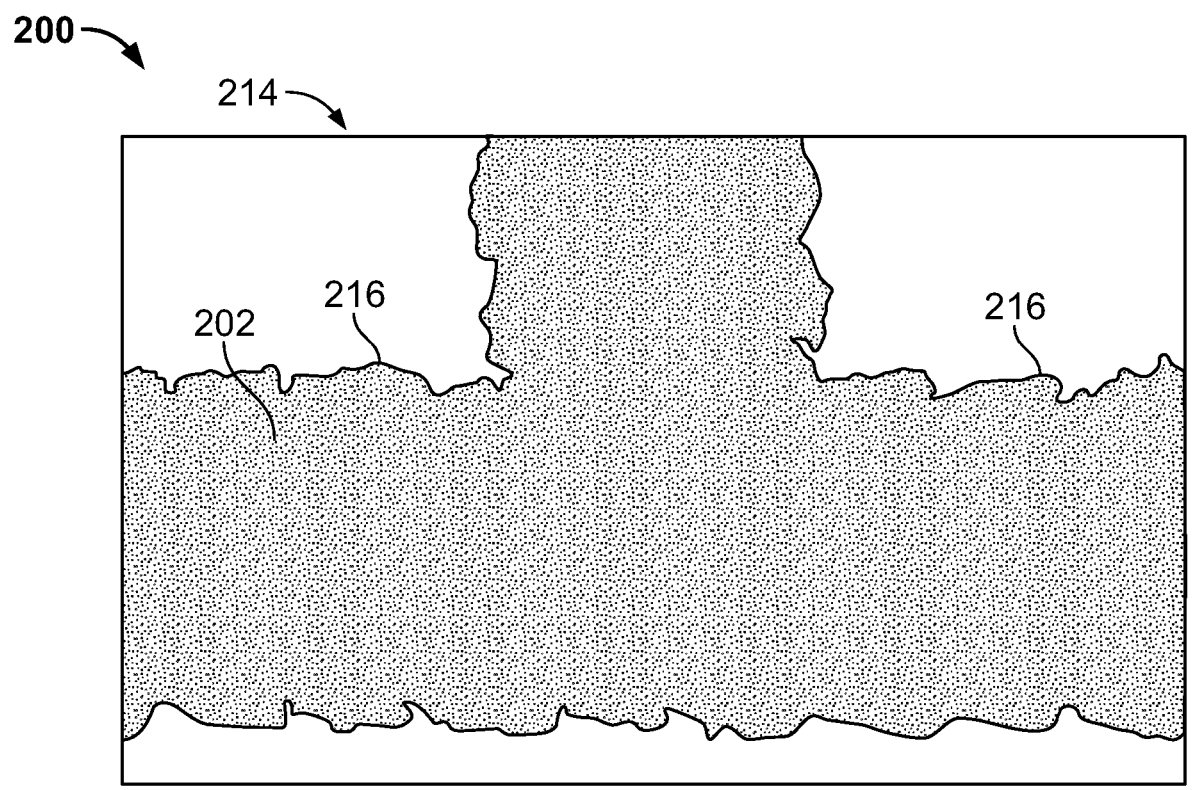
FIG. 2C is a top view of a portion of the example electrode pattern of FIG. 2A created using laser ablation scribing techniques.

FIG. 2C is a top view of a portion 214 of the electrode pattern 200 of FIG. 2A created using laser ablation rastering or scribing techniques. As a result of the indexing of pulses to etch the master pattern 118 into the base substrate 108, edges 216 of the lines 202 defining the electrode pattern 200 differ from the edges 211 of the electrode pattern 200 created via broad field laser ablation shown in FIG. 2B. For example, the edges 216 of the portion 214 created via rastering include curved, partially curved, or wave-like features corresponding to the iterative exposure of the portion 214 to individual pulses of the laser beam 124. Also, because the individual pulses irradiate adjacent portions of the base substrate 108, the curved or wave-like features of the edges 216 define a pattern or at least a partial pattern over the respective lines 202 in that in a first curved feature resulting from a first laser pulse of the laser beam 124 can resemble or partially resemble a second curved features resulting from a second laser pulse of the laser beam 124. Thus, the edges 216 of the electrode pattern 200 created via rastering can be distinguished from electrode patterns created via techniques such as photolithography, which can result in lines having random, irregularly shaped edges.

Figure 2D:
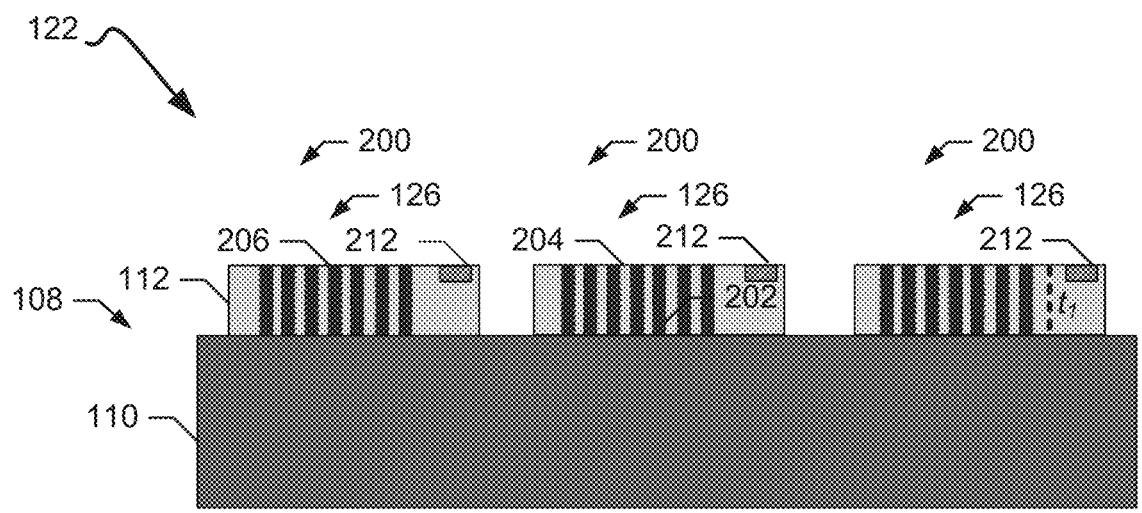
FIG. 2D is a cross-sectional view of the example base substrate including a plurality of electrode arrays, taken along the 1-1 line of FIG. 2A.

FIGS. 2A-C illustrate features of the electrode pattern 200 that are visible from a top view of the base substrate 108 after exposure to the laser beam 124 at the laser ablation station 114 of FIG. 1. FIG. 2D is a cross-sectional view of the portion 122 of the base substrate 108 after exposure to the laser ablation station 114 of the first example assembly 100 of FIG. 1, taken along the 1-1 line of FIG. 2A. As shown in FIG. 2D, the portion 122 includes the non-conductive first layer 110 and the conductive second layer 112 including replications of the electrode array 126 of the electrode pattern 200 formed across the base substrate 108. Although the portion 122 of the base substrate 108 is shown having three electrode arrays 126, the portion 122 can include less or additional electrode arrays 126 of the electrode pattern 200 of FIG. 2A. Also, the portion 122 is part of the base substrate or web 108.

As disclosed above with respect to FIG. 2A, the electrode arrays 126 include one or more arrays electrode 206. The laser beam 124 penetrates a thickness t of the conductive second layer 112 as the laser beam 124 pulses or etches the lines 202 and corresponding spacings 204 into the conductive second layer 112 to define the array electrodes 206. The depth of the penetration of the laser beam 124 into the conductive second layer 112 can be based on, for example, the thickness $t_1$ of the conductive second layer 112 and/or an intensity of the laser beam 124. In some examples, the laser beam 124 penetrates a depth substantially equal to the thickness $t_1$, less than the thickness $t_1$, or greater than the thickness $t_1$, such that the laser beam 124 penetrates a portion of the non-conductive layer 110, as will be disclosed below in connection with FIG. 2E. Also, the laser beam 124 defines features of the the electrode array 126 with respect to a resolution or a number of electrodes 206 per an area of the base substrate 108, the size of the array electrodes 206, and the configuration of lines 202 and the spacings 204 therebetween, which define a degree of inter-digitation of the array electrodes 206.

Although laser ablation results in a well-defined electrode pattern 200 including the electrode array 126 having increased resolution, in some examples, defects or imperfections in the mask 116 or the lens 120 can result corresponding defects in the based substrate 108. Such defects can include debris on the mask 116 or the lens 120, openings in the mask 116 that allow the laser beam 124 to irradiate the base substrate 108 where such exposure was not intended (e.g., an additional opening in the mask 116 or a wider than intended opening), and/or imperfections in the mask 116 that prevent the laser beam 124 from penetrating the base substrate 108 where the penetration was intended (e.g., incomplete openings in the mask 116). Debris (e.g., hair, dust, etc.) or imperfections in the mask 116 can result in interruptions or inconsistencies in the resulting electrode pattern 200, such as gaps or alterations to the shapes of the lines 202 and/or the spacings 204 defining the electrode pattern 200). Another example of a defect includes inconsistencies in the spacings 204 in the master pattern 118 due to a defect in the master pattern 118.

FIG. 2D illustrates the conductive second layer 112 of the base substrate 108 including defects or markings 212. In the example portion 122, the defects 212 are included in each of the iterations of the electrode array 126 of the electrode pattern 200 across the base substrate 108. However, the defects 212 can be located elsewhere in the electrode pattern 200, such as in connection with the non-array electrodes 208. In examples where the electrode pattern 200 is formed using broad field laser ablation, the defects 212 are systematic, or substantially identical in each of the electrode arrays 126 of the portion 122. In particular, the systematic occurrences of the defects 212 results from the exposure of the laser beam 124 over substantially the entire portion 122 to concurrently form multiple electrode patterns 200. Thus, the defects 212 are substantially uniformly replicated in each of the electrode patterns 200 irradiated into the conductive second layer 112 as the base substrate 108 is exposed to the laser beam 124 at the laser ablation station 114. For example, the defects 212 can be disposed at substantially the same position relative to the respective electrode patterns 200. Also, the defects 212 can be the substantially the same size within the respective electrode patterns 200. Therefore, the resulting substrate web, including the base substrate 108 and the electrode patterns 200, includes substantially identical, systematically reproduced defects 212 in each of the electrode patterns 200.

In some examples, markings such as the defects 212, could be purposeful. For example, such markings may be included as a signature that appears across all electrodes patterns 200 to identify a particular manufacturer, manufacturing run, product, or manufacturing location.

Figure 2E:
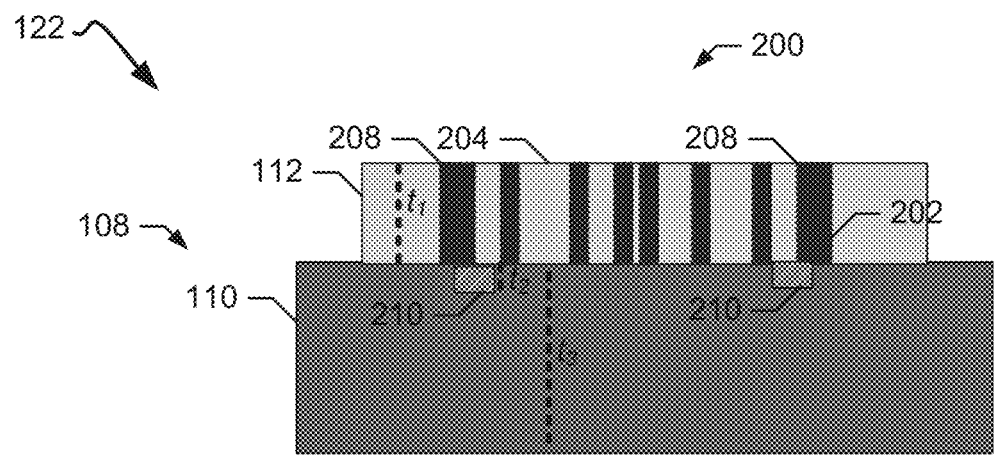
FIG. 2E is a cross-sectional view of the electrode pattern taken along the 2-2 line of FIG. 2A.

FIG. 2E is a cross-sectional view of the portion 122 including the electrode pattern 200 taken along the 2-2 line of FIG. 2A. As an example, FIG. 2E illustrate a section of the electrode pattern 200 other than the electrode array 126. For example, FIG. 2E illustrates the lines 202 and the spacings 204 defining one or more of the non-array electrodes 208.

As disclosed above with respect to the exposure of the base substrate 108 to the laser beam 124 in connections with FIGS. 1 and 2D, in some examples, the laser beam 124 selectively penetrates through the conductive second layer 112 and the non-conductive first layer 110. In such examples, the laser beam 124 penetrates through the thickness $t_1$ of the conductive second layer 112 and a thickness $t_2$ of the non-conductive first layer 110, which may be less or substantially less than a total thickness $t_3$ of the non-conductive first layer 110. The non-conductive first layer 110 absorbs some of the energy of the laser beam 124. As a result of the irradiation of the non-conductive first layer 110, a portion of the non-conductive first layer 110 having the thickness $t_2$ is ejected from the non-conductive first layer 110, which results in structural changes to the non-conductive first layer 110. The ejection of the portion of the non-conductive first layer 110 can result in ejection of a portion of the conductive second layer 112 to define the electrode pattern 200. As illustrated in FIG. 2E, the non-conductive first layer 110 includes one or more disturbances 210 due to the penetration of the laser beam 124. The portions or disturbances 210 includes indentations, spacings, openings, or grooves in the non-conductive first layer 110 resulting from the ejection of one or more portions of the irradiated non-conductive first layer 110. The respective thicknesses of the disturbances 210 depend on the thickness of the non-conductive first layer 110 and a depth of the penetration of the laser beam 124. Also, although the disturbances 210 are illustrated in FIG. 2E as rectangular in shape, the disturbances 210 can be substantially any shape including irregularly shaped, curved, or angled grooves or indentations corresponding to the shape of the fragments ejected from the non-conductive first layer 110.

Although laser ablation of the base substrate 108 at the laser ablation station 114 has been described with respect to the portion 122, it is to be understood that, as part of the continuous movement of the base substrate 108 through the first example assembly 100 via the first through third rollers 102, 104, 106, the laser beam 124 penetrates more than one portion of the base substrate 108 during operation of the first example assembly 100. In the first example assembly 100, as the base substrate 108 passes under and/or by the lens 120, successive portions n of the conductive second layer 112 are exposed to the laser beam 124 for repeatedly creating the master pattern 118 on each of the successive portions n. The size of the portions and the spacing between the portions as the base substrate 108 passes through the laser ablation station 114 may be predetermined based on, for example, the size and configuration of the master pattern 118, the dimensions of the base substrate 108, the thickness of the conductive second layer 112, and/or the dimensions of the droplet actuator with which the base substrate 108 will be associated.

Returning to FIG. 1, after the portion 122 undergoes laser ablation at the laser ablation station 114 to form the electrode array 126 (e.g., as part of the electrode pattern 200 of FIG. 2A), the portion 122 is moved, via rotation of the first through third rollers 102, 104, 106, to a printer 128. In the first example assembly 100, the printer 128 includes an apparatus or an instrument capable of applying at least one layer of material 130 having a hydrophobic and/or a dielectric property to the electrode array 126. In the first example assembly 100, the printer 128 can deposit the hydrophobic and/or dielectric material 130 via deposition techniques including, but not limited to, web-based coating (e.g., via rollers associated with the printer 128), slot-die coating, spin coating, chemical vapor deposition, physical vapor deposition, and/or atomic layer deposition. The printer 128 can also apply other materials in addition to the hydrophobic and/or dielectric material 130 (e.g., anti-fouling coatings, anti-coagulants). Also, the printer 128 can apply one or more layers of the material(s) with different thicknesses and/or covering different portions of the base substrate 108.

As described above, in the first example assembly 100, at least one of the first through third rollers 102, 104, 106 advance the base substrate or web 108 to the printer 128 for application of the hydrophobic and/or dielectric material 130 to the electrode array 126. In some examples, the printer 128 includes a plurality of registration rollers 131 to facilitate accuracy in feeding and registration of the base substrate 108 as part of operation of the printer 128 in applying the hydrophobic and/or dielectric material 130, for example, via roller coating methods.

In the first example assembly 100, the hydrophobic and/or dielectric material 130 is applied to the electrode array 126 to completely or substantially completely insulate the electrode array 126. For example, referring again to FIG. 2A, the printer 128 selectively applies the hydrophobic and/or dielectric material 130 to the electrodes 206 of the electrode array 126, however, the printer 128 does not apply the hydrophobic and/or dielectric material 130 to the other electrodes 208 of the electrode pattern 200. The selective application of the hydrophobic and/or the dielectric material 130 to the electrode pattern 200 provides for electrodes that are capable of making electrical contact with other electrodes (e.g., the non-array electrodes 208 that are not covered with the hydrophobic and/or dielectric material 130) as well as electrodes that are covered or coated as part of the electrode array 126 (e.g., the array electrodes 206). As a result of the hydrophobic and/or the dielectric material 130, a droplet placed proximate to the electrode array 126 is in a beaded configuration forming a contact angle with respect to the portion 122. In operation, the electrodes 206 of the coated electrode array 126 control the contact angle (e.g., a degree of the contact angle) via electric forces.

In some examples, the hydrophobic and/or dielectric material 130 is a polytetrafluoroethylene material (e.g., Teflon®) or a fluorosurfactant (e.g., FluoroPel™) applied to the conductive second layer 112 to substantially cover the electrode array 126. In other examples, the hydrophobic and/or dielectric material 130 is a dielectric such as a porcelain (e.g., a ceramic) or a plastic. In some examples, a dielectric is applied in combination with the hydrophobic material, such that the electrode array 126 is coated with a first layer of the dielectric and a second layer of, for example, Teflon® disposed on to the dielectric layer. In such examples, the first layer of dielectric may have a greater thickness than the second layer of the treated layer. Also, in some examples, an anti-fouling coating is applied to the electrode array 126 (e.g., as an additional layer or in connection with the hydrophobic and/or dielectric material 130) to reduce surface fouling that can result from accumulation of proteins other biological species during clinical use of the resulting droplet actuator and that may result in contamination of the microfluidic device. Other materials can be applied based on operational use of the droplet actuator. For example, an anti-coagulant material can be applied to prevent clotting of a biological specimen before an assay is completed.

In some examples, the hydrophobic and/or dielectric material 130 is deposited via the printer 128 in substantially liquid form. To create a structural, or treated layer 132 on the base substrate 108 to support a droplet, the portion 122 is moved via the rollers (e.g., the first through third rollers 102, 104, 106) through a curing station 134. At the curing station 134, the hydrophobic and/or dielectric material is treated and/or modified to form the first treated layer 132. Treating and/or modifying the hydrophobic and/or dielectric material can include curing the material. For example, at the curing station 134, heat is applied to facilitate the hardening of the hydrophobic and/or dielectric material 130. In some examples, the portion 122 is exposed to an ultraviolet light to cure the hydrophobic and/or dielectric material 130 and form the treated layer 132 to insulate the electrode array 126. In other examples, the curing and/or modification of the hydrophobic and/or dielectric material is accomplished without heat and/or a photon source. In some examples, the treated layer 132 supports a droplet as an electric field is applied (e.g., in connection with electrode array 126) to manipulate the droplet. For example, during an electrowetting process, a contact angle of the droplet with respect to the treated layer 132 changes as a result of an applied voltage, which affects the surface tension of the droplet on the treated surface 132.

After passing through the curing station 134, the portion 122 is prepared to serve as a bottom substrate of a droplet actuator and/or as a digital microfluidic chip. Because the base substrate 108 includes the non-conductive first layer 110 bonded with the conductive second layer 112, as disclosed above, additional adhesion of, for example, the electrode array 126 to the non-conductive first layer 110 is not required. Such a pre-adhered configuration increases the efficiency of the preparation of the base substrate 108 for the droplet actuator by reducing processing steps. Also, as described above, when the portion 122 is at any one of the laser ablation station 114, the printer 128, or the curing station 134, other portions n of the base substrate 108 are concurrently moving through the others of the respective stations 114, 128, 134 of the first example assembly 100. For example, when the portion 122 is at the curing station 134, the first through third rollers 102, 104, 106 are continuously, periodically, or aperidiocally advancing one or more other portions n of the base substrate 108 through, for example, the laser ablation station 114 and/or the printer 128. In such a manner, preparation of the base substrate 108 for the droplet actuator is achieved via a substantially continuous, high-speed, automated process.

Although the base substrate 108 may be considered as including successive portions, during some example operations of the first example assembly 100, the base substrate 108 remains as a single sheet or web as the successive portions undergo processing to create the electrode arrays 126 (e.g., via the electrode pattern 200 of FIG. 2A) and receive the coating of hydrophobic and/or dielectric material 130. Thus, to create one or more droplet actuators using the processed base substrate 108, the base substrate or web 108, in some examples, is cut (e.g., diced) to form individual units comprising the electrode arrays 126, as will be further disclosed below (e.g., FIGS. 4, 6). In some examples, prior to dicing, the base substrate 108, including the portion 122, is rewound in a rolled configuration similar to the initial rolled configuration of the base substrate 108 prior to being unwound by the first roller 102. Such rewinding may be accomplished via one or more rollers as part of the roll-to-roll processing. In such examples, the base substrate 108 may be diced or otherwise separated at a later time. In other examples, the rollers (e.g., the second and third rollers 104, 106), advance the base substrate 108 for merging with a top substrate, as will be further disclosed below (e.g., FIGS. 4, 6).

As described above, an example droplet actuator includes a base substrate, such as the base substrate 108 including the electrode array 126 (FIGS. 1 and 2) and a top substrate. The top substrate may include for example, an electrode pattern and associated electrode array created via laser ablation in substantially the same manner as the electrode pattern 200 and electrode array 126 of FIGS. 1 and 2, a single electrode (e.g., a layer of a conductive metal), or a non-conductive substrate (e.g., a dielectric). Alternatively, in some examples, the droplet actuator does not include a top substrate. In preparing the top substrate and/or a configuration of the top substrate, consideration is given to, for example, intended applications of the droplet actuator.

Figure 3:
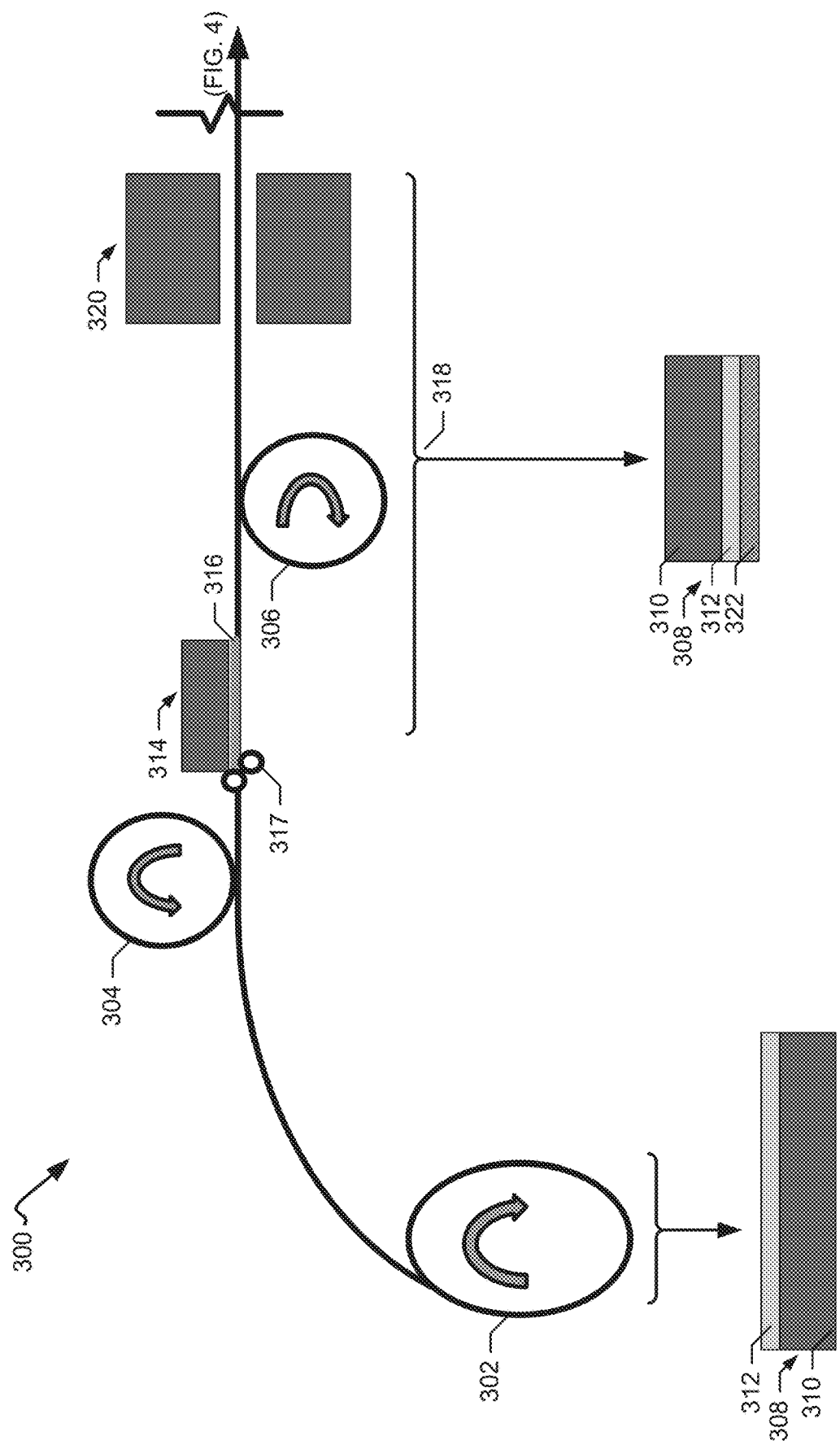
FIG. 3 is a diagram of a second example assembly for creating a top substrate of an example droplet actuator.

FIG. 3 illustrates a second example assembly 300 for creating an example top substrate of a droplet actuator having a single electrode. The second example assembly 300 includes a series or a plurality of rollers, including a first roller 302, a second roller 304, and a third roller 306, which operate in synchronized rotation to drive a top substrate 308 through the second example assembly 300. The second example assembly 300 can include rollers in addition to the first through third rollers 302, 304, 306 to move the top substrate 308 through the assembly 300. Prior to cutting or sizing of the top substrate 308, the top substrate 308 can be considered a substrate web that may be in a rolled, partially rolled, or unrolled configuration as the top substrate 308 moves through the second example assembly 300.

In the second example assembly 300, the first roller 302 rotates to unwind the top substrate 308, which, in some examples, is a sheet in a rolled configuration. The example top substrate 308 of FIG. 3 includes a first layer 310 and a second layer 312. As with the example base substrate 108, in this example, the example first layer 310 of the top substrate 308 comprises a non-conductive material such as, for example, a plastic, and the example second layer 312 includes a conductive material, such as a metal including, for example, one or more of gold, chrome, silver, or copper and/or any other suitable metal(s), conductive polymer(s), or combination(s) of metal(s) and/or conductive polymer(s). In some examples, the conductive second layer 312 is adhered to the non-conductive first layer 310 via an adhesive layer (e.g., chrome).

In the second example assembly 300, the first through third rollers 302, 304, 306 rotate to advance the top substrate 312 to a printer 314. The printer 314 coats the conductive second layer 312 with a hydrophobic and/or dielectric material 316 (e.g., Teflon® or a dielectric such as a ceramic). The printer 314 is substantially similar to the printer 128 of the first example assembly 100 of FIG. 1. For example, the printer 314 can apply the hydrophobic and/or dielectric material 316 to the top substrate 308 via web-based coating, slot-die coating, spin coating, chemical vapor deposition, physical vapor deposition, atomic layer deposition, and/or other deposition techniques. The printer 314 can include registration rollers 317 to facilitate alignment of the top substrate 308 with respect to the printer 314 during application of the hydrophobic and/or dielectric material 316 and/or other coating materials.

After receiving the coating of the hydrophobic and/or dielectric material 316, the second roller 104 and the third roller 106 advance the portion 318 to a curing station 320. As disclosed in connection with the curing station 134 of FIG. 1, the curing station 320 of the second example assembly 300 facilitates the modification (e.g., curing) of the hydrophobic material via heat to form a treated layer 322. The treated layer 322 insulates the conductive second layer 312, which serves as the single electrode of the top substrate 308, by completely or substantially completely covering the conductive second layer 312. Thus, in coating the second layer 312 of the portion 318, electrical potential conducting portion of the top substrate 308 is insulated from a droplet that may be applied to a droplet actuator that includes the portion 318.

After passing through the curing station 320, the portion 318 is prepared to serve as a top substrate of a droplet actuator. Because the top substrate 308 includes the non-conductive first layer 310 pre-adhered to the conductive second layer 312 prior to processing of the top substrate via the second example assembly 300, additional adhesion of, for example, an electrode to the non-conductive first layer 310 is not required, thereby increasing the efficiency of the preparation of the top substrate 308 for the droplet actuator.

Also, and as disclosed in connection with the first example assembly 100 of FIG. 1, in the second example assembly 300, the first through third rollers 302, 304, 306 rotate to advance the top substrate 308 such that portions of the top substrate pass through one of the printer 314 or the curing station 320 in substantially continuous, periodic and/or aperiodic succession as part of the roll-to-roll operation of the second example assembly 300. Thus, although the second example assembly 300 is described in association with the portion 318, it is to be understood that successive portions of the top substrate 308 are prepared in substantially the manner as the portion 318 as a result of rotation of the first through third rollers 302, 304, 306. In such a manner, the top substrate 308 is provided with a treated layer 322 along the length of the top substrate 308.

In the example top substrate 308, the conductive second layer 312 serves an electrode. However, in some examples, the conductive second layer 312 undergoes laser ablation to form one or more electrode arrays. In such examples, the second example assembly 300 includes a laser ablation station substantially similar to the laser ablation station 114 of the first example assembly 100 of FIG. 1. Thus, prior to receiving the hydrophobic material 316, the top substrate 308 is exposed to a laser beam, which creates an electrode pattern in the irradiated conductive second layer 312. The electrode pattern formed on the top substrate 308 can be the same or different from the electrode pattern formed on the base substrate 108 of FIG. 1. In examples where the top substrate 308 is ablated via a laser, the second example assembly 300 is substantially similar to the first example assembly 100. Also, in some examples, the electrode array is not formed on/in the base substrate 108 but only on/in the top substrate 308.

During operation of the second example assembly 300, the top substrate remains single sheet as successive portions of the top substrate 308 are coated with the hydrophobic material 316. As part of the fabrication of one or more droplet actuators, the top substrate 308 is aligned with the base substrate (e.g., the base substrate 108 of FIG. 1). In some examples, after passing through the curing station 320, the top substrate is rewound into a rolled configuration via one or more rollers. In such examples, the finished roll may be diced or otherwise cut and/or separated into individual units that are aligned at a space apart distance and bonded with individual diced units of the base substrate 108 of FIG. 1 to create a droplet actuator.

In other examples, after passing through the curing station 320, the rollers (e.g., the first through third rollers 302, 304, 306) continue to advance the top substrate 308 to merge the top substrate 308 with the base substrate 108 of FIG. 1 via automated roll-to-roll processing, as will be discussed below in connection with FIG. 4. In such examples, to prepare the top substrate 308 for alignment with the base substrate 108, the rollers of the second example assembly 300 (e.g., the first through third rollers 302, 304, 306) rotate so as to reverse the orientation of the top substrate 308 relative to the base substrate 108 of FIG. 1 such that the treated layer 132 of the base substrate 108 faces the treated layer 322 of the top substrate 308 when the base substrate 108 and the top substrate 308 are aligned in parallel configuration (see, e.g., FIG. 4).

Figure 4:
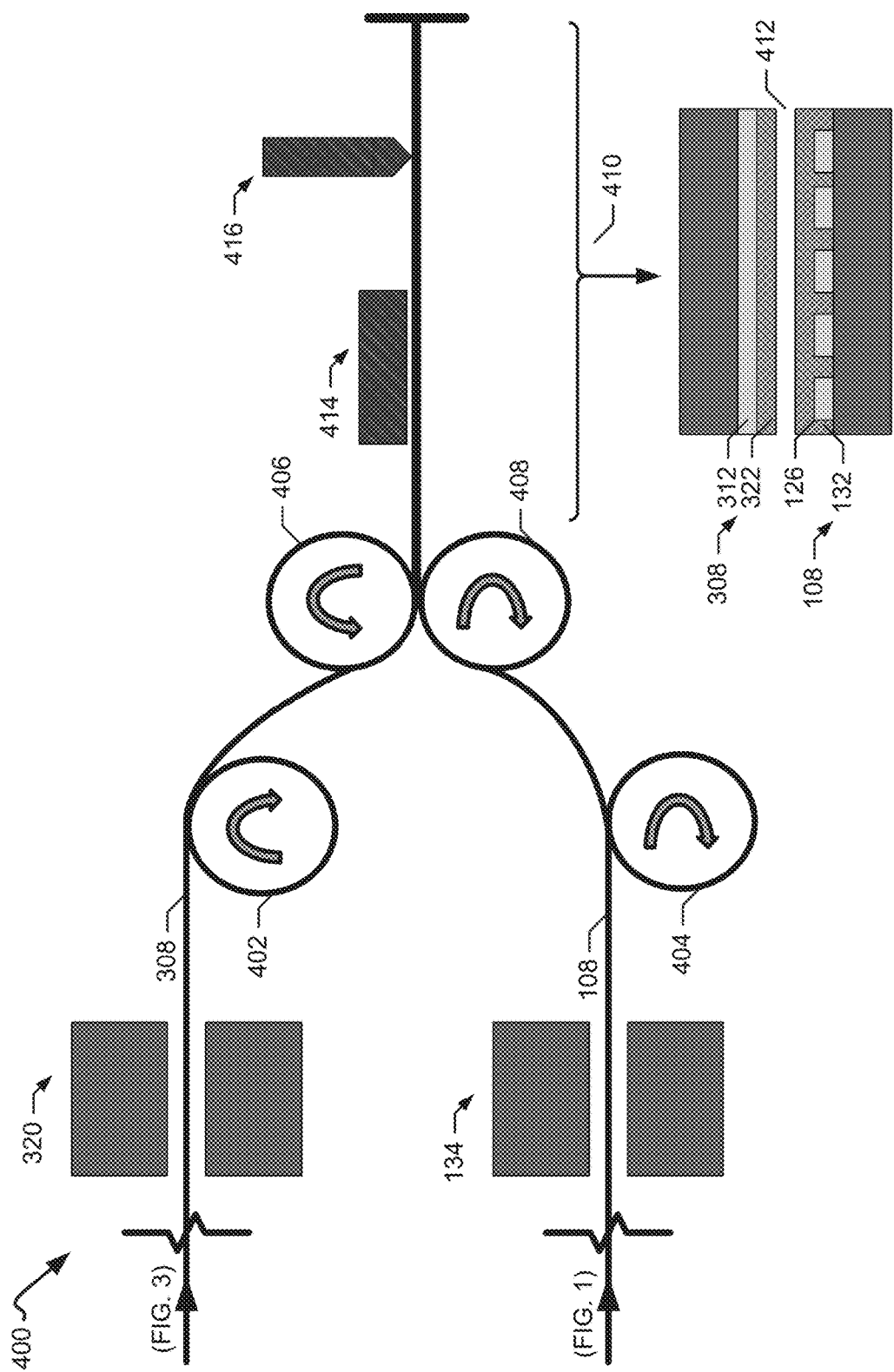
FIG. 4 is a diagram of a third example assembly for merging the example base substrate created via the first example assembly of FIG. 1 with the example top substrate created via the second example assembly of FIG. 3.

FIG. 4 is a diagram of a third example assembly 400 for processing the substrate webs. The example assembly 400 operates to merge a base substrate with a top substrate to fabricate a droplet actuator via roll-to-roll processing. The third example assembly 400 can be implemented in connection with the first example assembly 100 of FIG. 1 and the second example assembly 300 of FIG. 3 to fabricate a droplet actuator from the base substrate 108 of FIG. 1 and the top substrate 308 of FIG. 3. For example, as shown in FIG. 4, after passing through the curing station 320 associated with the second example assembly 300, the top substrate 308 is advanced by a first roller 402 of the third example assembly 400. Similarly, after passing through the curing station 134 associated with the first example assembly 100, the base substrate 108 is advanced by a second roller 402 of the third example assembly 400 to facilitate alignment of the substrates 108, 308.

The third example assembly 400 includes a third roller 406 and a fourth roller 408 that form a pair of merging rollers to which the base substrate 108 and the top substrate 308 are fed via the respective first roller 402 and the second roller 404 of the third example assembly 400. As each of the merging rollers 406, 408 rotates, the base substrate 108 and the top substrate 308 are aligned in a parallel configuration at a predetermined spaced apart distance, or gap.

For example, FIG. 4 illustrates a merged portion 410 including the base substrate 108 and the top substrate 308 in parallel alignment and including a gap 412 separating the treated layer 132 of the base substrate 108 and the treated layer 322 of the top substrate 108. The gap 412 is a predetermined spaced apart distance between the treated layers 132, 322. The gap 412 can be created using one more gap formation techniques. Such techniques can include, for example, inserting one or more capillary tubes and/or microbeads between the base and top substrates 108, 308 to serve as spacers to separate the respective treated layers 132, 322. Additionally or alternatively, other examples for forming and/or maintaining the gap include embossing or molding pillars into, for example, the non-conductive first layer 110 of the base substrate 108 to provide a frame to separate the base substrate 108 and the top substrate 308. Further still, other additional or alternative examples for forming and/or maintaining the gap include laminating one or more of the treated layers 132, 322 of the respective base substrate 108 and the top substrate 308 to create a film to separate the substrates or spraying a filler fluid (e.g., a fluid immiscible with the droplet fluid) on at least a portion of the substrates 108, 308. In some examples, the gap formation techniques may be implemented via roll-to-roll processing. For example, as one or more the base substrate 108 or the top substrate 308 passes proximate to one or more rollers of the first through third example assemblies 100, 300, 400, one or more of the rollers may provide for embossing and/or lamination of the base substrate 108 and/or the top substrate 308.

Similarly, in examples where the base substrate 108 and the top substrate 308 are rewound as individual rolls (e.g., as part of the first example assembly 100 of FIG. 1 and the second example assembly 300 of FIG. 3), diced separately, and then aligned, the base substrate 108 and the top substrate 308 are also arranged so that a gap exists between treated layers 132, 322 of the respective base substrate 108 and the top substrate 308.

As show in FIG. 4, the example third assembly 400 includes a bonding station 414. The bonding station 414 joins, or bonds, the base substrate 108 and the top substrate 308 as part of fabricating the droplet actuator. For example, at the bonding station 414, one or more adhesives may be selectively applied to a predefined portion of the base substrate 108 and/or the top substrate 308 (e.g., a portion of the base substrate 108 and/or the top substrate 308 defining a perimeter of the resulting droplet actuator) to create a bond between the base substrate 108 and the top substrate 308 while preserving the gap 412. In some examples, bonding the substrates 108, 308 at the bonding station 414 including forming the gap 412 (e.g., in advance of applying the adhesive).

Examples of adhesive(s) that may be used at the bonding station 414 include epoxies, foils, tapes, and/or ultraviolet curable adhesives. In some examples, layers of polymers such as SU-8 and/or polydimethylsiloxane (PDMS) are applied to the base substrate 108 and/or the top substrate 308 to bond the substrates. Also, in some examples, the bonding station 414 provides for curing of the adhesive(s) via, for example, ultraviolet light. The bonding station 414 may apply one more methods involving, for example, heat (e.g. thermal bonding), pressure, curing, etc. to bond the base substrate 108 and the top substrate 308.

In the example third assembly 400, the merged portion 410 can be selectively cut, diced or otherwise separated to form one or more droplet actuators, as substantially represented in FIG. 4 by the merged portion 410. The example third assembly 400 includes a dicing station 416. The dicing station 416 can be, for example, a cutting device, a splitter, or more generally, an instrument to divide the continuous merged portion 410 into discrete units corresponding to individual droplet actuators. The merged portion 410 may be cut into individual droplet actuators based on, for example, the electrode pattern 200 of FIG. 2A such that each droplet actuator includes a footprint of the electrode array 126 and the other electrodes that are formed via the electrode pattern 200 (e.g., the non-array electrodes 208). During operation of the resulting droplet actuator, the gap 412 can receive a droplet that can be manipulated using electrical potentials via the insulated electrodes 206 of the electrode array 126 of the base substrate 108 (e.g., the conductive second layer 112) and/or the insulated electrode of the top substrate 312 (e.g., the conductive second layer 312). The insulated nature of the conductive surfaces of the base substrate 108 and the top substrate 108 prevents unintended chemical reactions or changes to the droplet fluid due to exposure to the electrodes, thereby protecting the integrity of the droplet manipulation and analysis.

Figure 5:
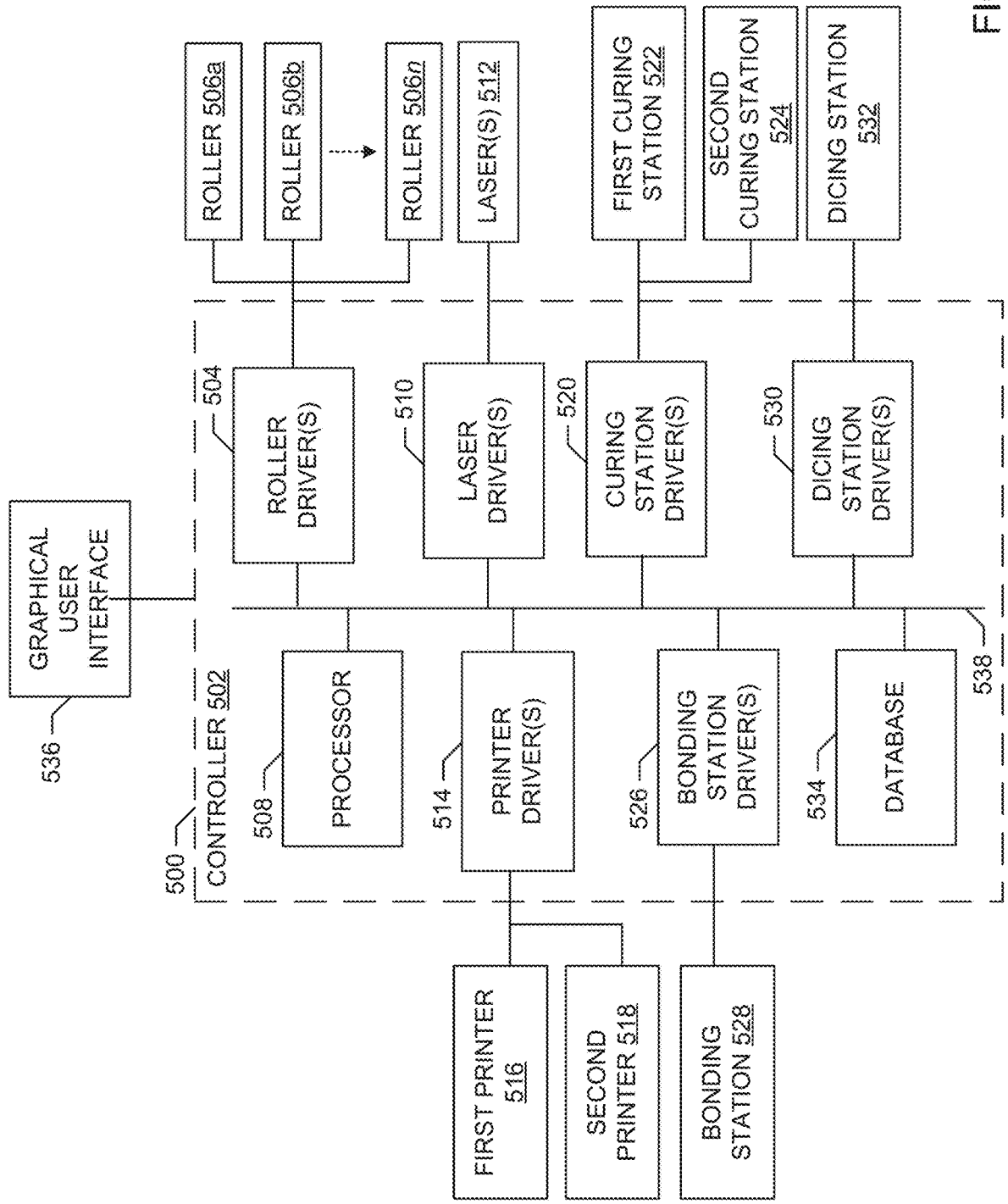
FIG. 5 is a block diagram of an example processing system for the first example assembly of FIG. 1, the second example assembly of FIG. 3, and the third example assembly of FIG. 4.

FIG. 5 is a block diagram of an example processing system 500 for use with a droplet actuator fabrication assembly such as, for example, the first, second, and/or third example assemblies 100, 300, 400 of FIGS. 1, 3 and 4 for processing one or more substrate webs. The example processing system 500 includes a controller 502, which controls operation the first, second, and/or third example assembles 100, 300, 400 via selected driver components.

For example, the example processing system 500 includes a roller driver 504, which controls one or more of the rollers of the first, second, and/or third example assembles 100, 300, 400. In some examples, the example processing system 500 includes one or more roller drivers 504. In the example shown, the roller driver(s) 504 are communicatively coupled to rollers 506*a-n*. The rollers 506*a-n* may correspond, for example, to the first through third rollers 102, 104, 106 of the first example assembly 100; the first through third rollers 302, 304, 306 of the second example assembly 300; and/or the first through fourth rollers 402, 404, 406, 408 of the third example assembly 400. The roller driver(s) 504 control rotation of the rollers 506*a-n* using, for example, a motor, to regulate one or more operational characteristics of the rollers. Such operational characteristics may include speed of rotation, duration of rotation, direction of rotation, acceleration, etc. of the rollers 506*a-n*. One or more of the operational characteristics controlled by the roller driver(s) 504 at least partially determine a position of a portion of the one or more substrates fed through the first, second, and third example assemblies 100, 300, 400 (e.g., the portion 122 of the base substrate 108, the portion 318 of the top substrate 308, and/or the merged portion 410) at any time during the operation of the rollers 506*a-n*. Further, one or more of the operational characteristics controlled by the roller driver(s) 504, such as speed of rotation, at least partially determine a duration for which a portion of the substrates is exposed to one or more stations of the first, second, and third example assemblies 100, 300, 400 (e.g., the laser ablation station 114 of the first example assembly 100). Thus, the roller driver(s) 504 control rate at which the one or more substrates are processed. Also, an example processor 508 operates the roller driver(s) 604 and, thus, the first, second, and third example assemblies 100, 300, 400 in accordance with a droplet actuator fabrication protocol.

The example processing system 500 also includes a laser driver 510. In some examples, the example processing system 500 includes one or more laser drivers 510. In the example shown, the one or more laser driver(s) 510 are communicatively coupled to one or more lasers 512 to control the laser(s) 512. The laser(s) 512 may correspond to, for example, the laser beam 124 of the laser ablation station 114 of the first example assembly 100. In some examples, the second example assembly 400 includes a laser ablation station having a laser beam. In such examples, the laser driver(s) 510 also control the laser associated with the second example assembly 400. The laser driver(s) 510 control, for example, the intensity of the laser(s) 512, a size of surface area of irradiation with respect to the substrate(s), the depth to which the laser(s) 512 penetrate a substrate (e.g., the conductive second layer 112 and the non-conductive first layer 110 of the base substrate 108), and/or a duration for which the laser(s) 512 do or do not penetrate the substrate. The laser driver(s) 510 also control a manner in which the laser(s) 512 are exposed on the substrate(s), including whether the laser(s) 512 iteratively irradiate the substrate(s) as part of laser ablation rastering techniques or whether the laser(s) 512 are exposed over an predetermined surface area of the substrate(s) for inscribing an electrode pattern in the substrate(s) via a single exposure of the laser via broad field laser ablation. In examples where the laser(s) 512 iteratively etch the pattern into the subtrate(s), the laser driver(s) 510 control the movement (e.g., direction and speed) of the laser(s) 512 across the substrate(s). Also, the example processor 508 operates the laser driver(s) 510 and, thus, the laser(s) 512 in accordance with a laser ablation protocol.

The example processing system 500 also includes a printer driver 514 which controls one or more of the printers of the first and/or second example assemblies 100, 300. In some examples, the example processing system 500 includes one or more printer drivers 514. In the example shown, the printer driver(s) 514 are communicatively coupled to a first printer 516 and a second printer 518. The first printer 516 may correspond, for example, to the printer 128 of the first example assembly 100. The second printer 518 may correspond, for example, to the printer 314 of the second example assembly 300. The printer driver(s) 514 control, for example, the thickness, width, and/or pattern of the hydrophobic and/or dielectric material applied to the substrates by the first printer 516 and the second printer 518. In examples where the hydrophobic and/or dielectric material is applied via web-based printing, the printer driver(s) 514 can control a pressure with which rollers associated with the first printer 516 and/or the second printer 518 contact the substrates and thus, affect the quality of the hydrophobic and/or dielectric layer of material applied to the electrode array. In some examples, the first printer 516 and the second printer 518 operate in connection with the rollers 506*a-n*. In such examples, the printer driver(s) 514 work in association with the roller driver(s) 504 to define, for example, a rate at which the hydrophobic and/or dielectric material is deposited on the substrates. Also, the example processor 508 operates the printer driver(s) 514 and, thus, the first printer 516 and the second printer 518 in accordance with a hydrophobic and/or dielectric material application protocol.

The example processing system 500 also includes a curing station driver 520 that controls one or more of the curing stations of the first and/or second example assembles 100, 300. In some examples, the example processing system 500 includes one or more curing station drivers 520. In the example shown, the curing station driver(s) 520 are communicatively coupled to a first curing station 522 and a second curing station 524. The first curing station 522 may correspond, for example, to the first curing station 134 of the first example assembly 100. The second curing station 524 may correspond, for example, to the second curing station 320 of the second example assembly 300. The curing station driver(s) 520 control, for example, the intensity of heat and/or ultraviolet light applied to the substrates, the size of an area of the substrates exposed to the heat and/or ultraviolet light, a duration of exposure of the heat and/or ultraviolet light, etc. Also, the example processor 508 operates the curing station driver(s) 520 and, thus, the first curing station 522 and the second curing station 524 in accordance with a hydrophobic and/or dielectric material curing protocol.

The example processing system 500 also includes a bonding station driver 526 that controls the bonding station of the third example assembly 400. In some examples, the example processing system 500 includes one or more bonding station drivers 526. In the example shown, the bonding station driver(s) 526 are communicatively coupled to a bonding station 528. The bonding station 528 may correspond, for example, to the bonding station 414 of the third example assembly 400. The bonding station driver(s) 526 control, for example, a thickness with which the adhesive is applied, a configuration or layout in which the adhesive is applied, a duration and/or intensity of heat applied to facilitate curing or thermal bonding, a pressure applied to bond the substrates, etc. In some examples, the bonding station driver(s) also control formation of a gap between the substrates (e.g., via lamination). Also, the example processor 508 operates the bonding station driver(s) 526 and, thus, the first bonding station 528 in accordance with a substrate bonding protocol.

The example processing system 500 also includes a dicing station driver 530 that controls the dicing station of the third example assembly 400. In some examples, the example processing system 500 includes one or more dicing station drivers 526. In the example shown, the dicing station driver(s) 530 are communicatively coupled to a dicing station 532. The dicing station 532 may correspond, for example, to the dicing station 416 of the third example assembly 400. The dicing station driver(s) 530 control, for example, the cutting or splitting of the substrate webs (e.g., the bonded substrates or, in some examples, the substrates as individual layers), a size of the discrete units into which the substrates are cut, a spacing between discrete units formed from the continuous substrates, an operational speed of a cutting instrument, retraction of the cutting instrument, etc. Also, the example processor 508 operates the dicing station driver(s) 530 and, thus, the dicing station 532 in accordance with a substrate web dicing protocol.

The example processing system 500 also includes a database 534 that may store information related to the operation of the example system 500. The information may include, for example, information about the length and dimensions of the substrates to be fed through the first, second, and/or third example assemblies 100, 300, 400; the materials comprising the substrates (e.g., type of metal of the conductive second layer 112 of the base substrate 108), rotational characteristics of the rollers, such as a speed and/or diameter; the electrode pattern(s) to be ablated on the substrate(s) via the laser(s); properties of the hydrophobic, dielectric, adhesive, and/or other material(s) to be applied to the substrates, etc.

The example processing system 500 also includes a user interface such as, for example, a graphical user interface (GUI) 536. An operator or technician interacts with the processing system 500, and thus, the first, second, and/or third example assemblies 100, 300, 400 via the interface 536 to provide, for example, commands related to operation of the rollers 506a-n such as speed, duration of rotation, etc. of the rollers; the pattern(s) to be ablated on the substrates via the laser(s) 512; the intensity of the laser(s) 512; the type of hydrophobic and/or dielectric material(s) to be applied to the substrates by the printers; the intensity of the curing stations 522, 524; the size of the gap in aligning the base substrate and top substrate via the rollers 506a-n, the adhesives applied to bond the substrates at the bonding station 528; the size of the discrete units into which the substrates are cut via the dicing station 532; etc. The interface 536 may also be used by the operator to obtain information related to the status of any substrate processing completed and/or in progress, check parameters such as speed and alignment, and/or to perform calibrations.

In the example shown, the processing system components 502, 504, 508, 510, 514, 520, 526, 530, 534 are communicatively coupled to other components of the example processing system 500 via communication links 538. The communication links 538 may be any type of wired connection (e.g., a databus, a USB connection, etc.) and/or any type of wireless communication (e.g., radio frequency, infrared, etc.) using any past, present or future communication protocol (e.g., Bluetooth, USB 2.0, USB 3.0, etc.). Also, the components of the example system 500 may be integrated in one device or distributed over two or more devices.

While an example manner of implementing the first, second, and/or third example assemblies 100, 300, 400 of FIGS. 1, 3, and 4 is illustrated in FIG. 5, one or more of the elements, processes and/or devices illustrated in FIG. 5 may be combined, divided, re-arranged, omitted, eliminated and/or implemented in any other way. Further, the example controller 502, the example roller driver(s) 504, the example processor 508, the example laser driver(s) 510, the example printer driver(s) 514, the example curing station driver(s) 520, the example bonding station driver(s) 526, the example dicing station driver(s) 530, the example database 534 and/or, more generally, the example processing system 500 of FIG. 5 may be implemented by hardware, software, firmware and/or any combination of hardware, software and/or firmware. Thus, for example, any of the example controller 502, the example roller driver(s) 504, the example processor 508, the example laser driver(s) 510, the example printer driver(s) 514, the example curing station driver(s) 520, the example bonding station driver(s) 526, the example dicing station driver(s) 530, the example database 534 and/or, more generally, the example processing system 500 of FIG. 5 could be implemented by one or more analog or digital circuit(s), logic circuits, programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example controller 502, the example roller driver(s) 504, the example processor 508, the example laser driver(s) 510, the example printer driver(s) 514, the example curing station driver(s) 520, the example bonding station driver(s) 526, the example dicing station driver(s) 530, and/or the example database 534 is/are hereby expressly defined to include a tangible computer readable storage device or storage disk such as a memory, a digital versatile disk (DVD), a compact disk (CD), a Blu-ray disk, etc. storing the software and/or firmware. Further still, the example processing system 500 of FIG. 5 may include one or more elements, processes and/or devices in addition to, or instead of, those illustrated in FIG. 5, and/or may include more than one of any or all of the illustrated elements, processes and devices.

Figure 6:
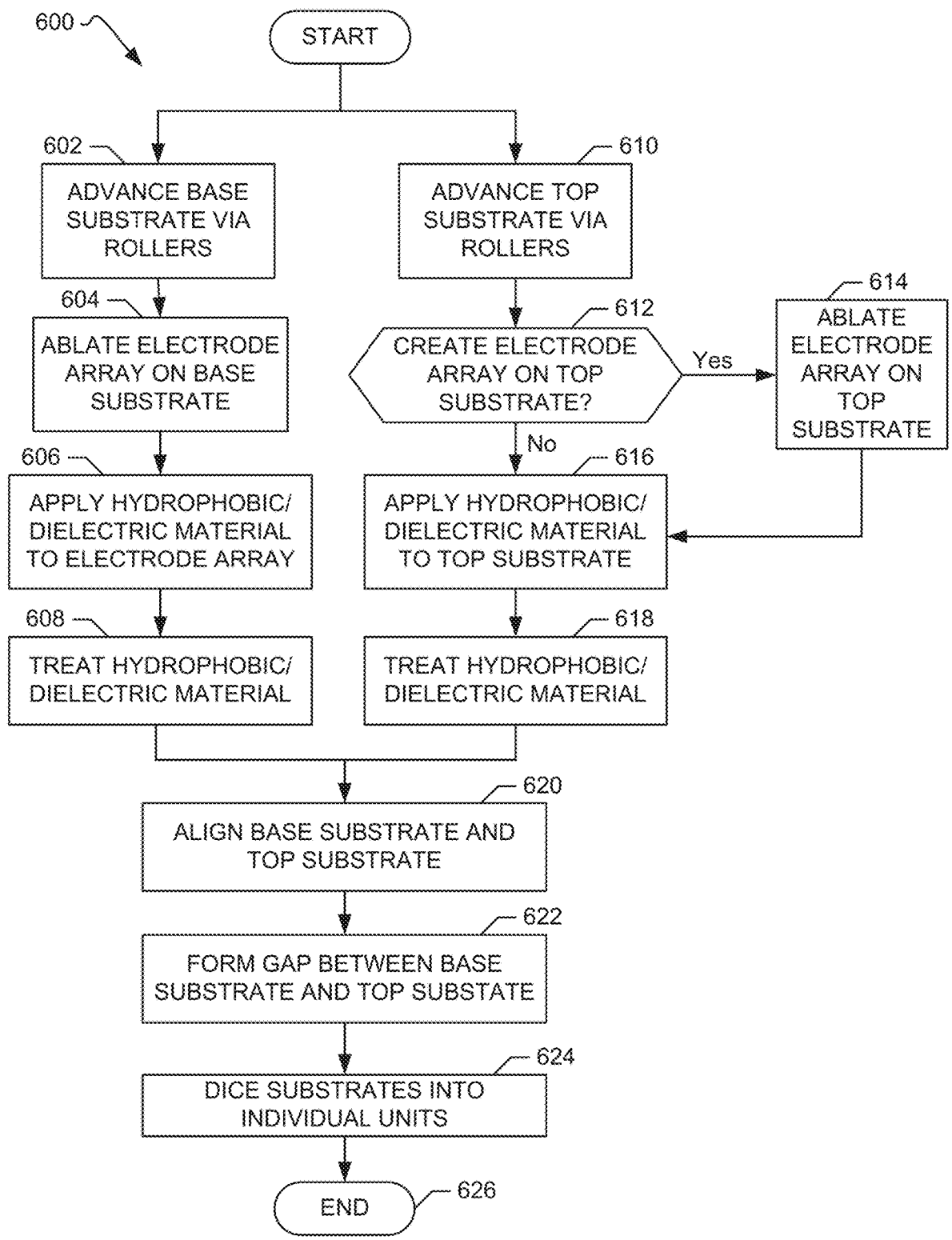
FIG. 6 is a flow diagram of an example method that can be used to implement the examples disclosed herein.

A flowchart representative of example machine readable instructions for implementing the first, second, and third example assemblies 100, 300, 400 and/or the example processing system 500 of FIGS. 1, and 3-5 is shown in FIG. 6. In this example, the machine readable instructions comprise a program for execution by a processor such as the processor 712 shown in the example processor platform 700 discussed below in connection with FIG. 7. The program may be embodied in software stored on a tangible computer readable storage medium such as a CD-ROM, a floppy disk, a hard drive, a digital versatile disk (DVD), a Blu-ray disk, or a memory associated with the processor 712, but the entire program and/or parts thereof could alternatively be executed by a device other than the processor 712 and/or embodied in firmware or dedicated hardware. Further, although the example program is described with reference to the flowchart illustrated in FIG. 6, many other methods of implementing the example first, second, and third example assemblies 100, 300, 400 and/or the example processing system 500 may alternatively be used. For example, the order of execution of the blocks may be changed, and/or some of the blocks described may be changed, eliminated, or combined.

As mentioned above, the example process of FIG. 6 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 6 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 6 depicts an example flow diagram representative of an example method 600 that may be implemented to fabricate a droplet actuator via operation of the first, second, and third example assemblies 100, 300, 400. The example method 600 may be implemented by advancing a web of a base substrate via rollers (block 602). For example, the first, second, and third rollers 102, 104, 106 may unwind and drive the base substrate or web 108 of FIG. 1 through the rollers. In some examples, the rollers 102, 104, 106 are controlled by the roller drivers(s) 504 of FIG. 5. The example method 600 also includes ablating an electrode array on the base substrate (block 604). For example, the base substrate 108 may pass, via the rollers, to the laser ablation station 114 of FIG. 1. The laser beam 124 penetrates the base substrate 108 (e.g., the conductive second layer 112) to selectively remove, or ablate, material from the base substrate 108 to form an electrode array 126. The laser beam 124 may be controlled by the laser driver(s) 510 of FIG. 5.

The example method 600 also includes applying a hydrophobic and/or dielectric material to the electrode array (block 606). In the example method 600, the hydrophobic and/or dielectric material can be a hydrophobic material such as Teflon®, a dielectric, or a combination thereof. In some examples of the example method 600, the printer 128 of FIG. 1 applies the hydrophobic and/or dielectric material to the electrode array 126 of the base substrate 108. In the example method 600, the hydrophobic and/or dielectric material substantially completely covers, or insulates, the electrode array 126. In some examples, the printer 128 is controlled by the printer driver(s) 514 of FIG. 5.

In the example method 600, the hydrophobic and/or dielectric material is treated (e.g., cured or otherwise modified), to form a treated layer on the base substrate (block 608). For example, heat and/or an ultraviolet light is applied to the base substrate to harden the hydrophobic material. The heat and/or the ultraviolet light can be applied via the curing station 134 of FIG. 1. In some examples, curing station driver(s) 520 of FIG. 5 control the curing station 134.

After treating the hydrophobic and/or dielectric material, the base substrate is ready for implementation as a bottom substrate of a droplet actuator. In the example method 600, a top substrate (e.g. a substrate web) is concurrently processed for implementation as a top substrate of the droplet actuator. In other examples of the example method 600, the top substrate is processed at a different time than the bottom substrate.

To prepare the top substrate for implementation as part of a droplet actuator in association with the base substrate, the example method 600 includes advancing the top substrate via rollers (block 610). In some examples, the first, second, and third rollers 302, 304, 306 of FIG. 3 unwind and drive the top substrate 308 through the second example assembly 300. Also, in some examples, the rollers 302, 304, 306 are controlled by the roller driver(s) 504.

The example method 600 includes a decision whether to create an electrode array on the top substrate (block 612). The top substrate can include a single electrode (e.g., a continuous layer of conductive material), an electrode array (e.g., a pattern including a plurality of electrodes), or a non-conductive material. If a decision is made at block 612 to create an electrode array on the top substrate, the example method 600 proceeds to block 614, where an electrode array is created on the top substrate (e.g., the conductive second layer 312 of the top substrate 308) via laser ablation. The laser ablation of the top substrate is performed in the substantially the same manner as the ablation of the base substrate at block 604 (e.g., via a laser to selectively remove conductive material in accordance with an electrode pattern).

If a decision is made not to create an electrode array on the top substrate (block 612), the example method 600 continues where a hydrophobic and/or dielectric material is applied to the top substrate (block 616). Also, in examples where an electrode array is formed on the top substrate (block 614), the example method 600 proceeds to block 616. In both instances, at least a portion of the top substrate is coated with the hydrophobic and/or dielectric material to, for example, insulate a single electrode or the electrode array associated with the top substrate. For example, the hydrophobic printer 314 of FIG. 3 may deposit a hydrophobic and/or dielectric material on the top substrate. In some examples, the printer 314 is controlled via the printer drivers of FIG. 5.

In the example method 600, the hydrophobic and/or dielectric material applied to the top substrate is treated (block 618). Treating the hydrophobic and/or dielectric material on the top substrate may be performed substantially as described in connection with respect to treating the hydrophobic and/or dielectric material of the base substrate at block 608 (e.g., via heat and/or ultraviolet light applied via the curing station 320 of FIG. 3 and controlled by the curing station driver(s) 520 of FIG. 5).

In the example method 600, the top substrate is processed for implementation as part of a droplet actuator in connection with the base substrate. To form the droplet actuator, the example method 600 includes aligning the base substrate and the top substrate (block 620). In some examples, the base substrate and the top substrate are configured as individual rolls (e.g., via the respective rollers of the first and second example assemblies 100, 300 after the curing at blocks 608 and 618). In such examples, aligning the base substrate and the top substrate includes aligning the individual rolls or aligning discrete portions of the base substrate and the top substrate if, for example, the individual rolls have been diced into discrete portions corresponding to predetermined dimensions of the droplet actuator (see block 624). In other examples, aligning the base substrate and the top substrate is accomplished as part of continued advancement of the base substrate and top substrate via rollers such that the base substrate and the top substrate are merged and bonded prior to dicing (e.g., as described in connection with the third example process 400 of FIG. 4). The base substrate and the top substrate may be bonded via an adhesive applied at the bonding station 414 of FIG. 4.

Whether the alignment of the base substrate and the top substrate (e.g., the base substrate web and the top substrate web) occurs via alignment of discrete rolls and/or portions or as part of a roll-to-roll process (block 620), the example method 600 includes forming a gap between the base substrate and the top substrate (block 622). In the example method 600, the gap can be formed by, for example, the insertion of capillary tubes between the substrates, embossing, and/or lamination of the hydrophobic and/or dielectric surfaces of the substrates.

The example method 600 includes dicing the substrate webs into individual units (block 624). In some examples, the dicing occurs as part of the roll-to-roll process such that the bonded base substrate and top substrate are cut into an individual unit including the base substrate, the top substrate, and the gap. In examples where the base substrate and the top substrate are rolled into individual rolls (e.g., after the respective first and second example processes 100, 300), the substrates are cut into discrete units separately to form the droplet actuator and to subsequently undergo bonding and gap formation (e.g., blocks 620, 622). In the example method 600, the substrate(s) may cut via a cutting or splitting instrument at the dicing station 416 of FIG. 4. At the end of the example method 600 (block 626), the droplet actuator can receive a droplet on the hydrophobic and/or dielectric surfaces of the substrates via the gap for manipulation by electrical potentials delivered via the base substrate and/or the top substrate.

Figure 7:
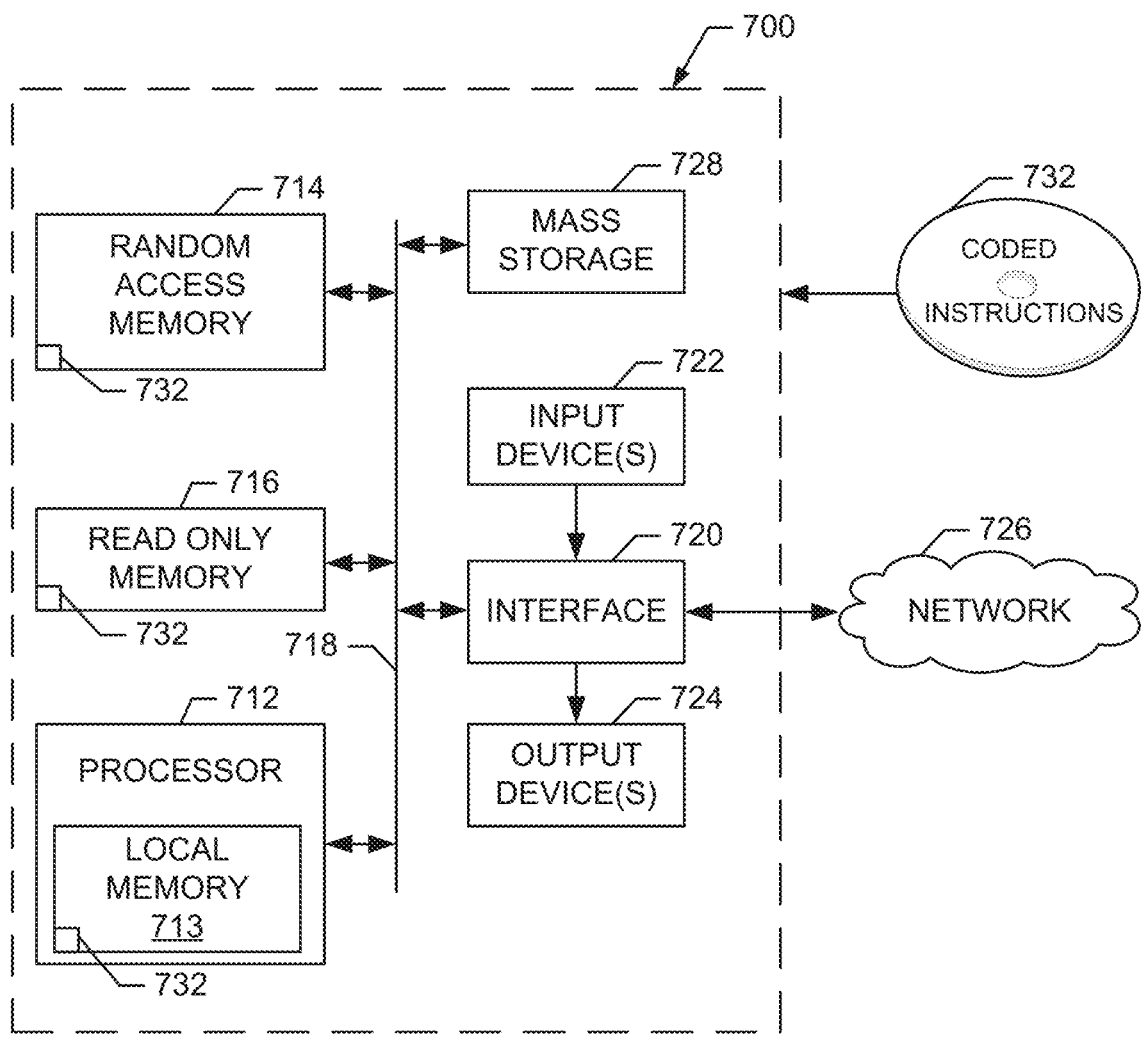
FIG. 7 is a diagram of a processor platform for use with the examples disclosed herein.

FIG. 7 is a block diagram of an example processor platform 700 capable of executing the instructions of FIG. 6 to implement the apparatus and/or system of FIGS. 1 and 3-5. The processor platform 700 can be, for example, a server, a personal computer, a mobile device (e.g., a cell phone, a smart phone, a tablet such as an iPad™) a personal digital assistant (PDA), an Internet appliance, or any other type of computing device.

The processor platform 700 of the illustrated example includes a processor 712. The processor 712 of the illustrated example is hardware. For example, the processor 712 can be implemented by one or more integrated circuits, logic circuits, microprocessors or controllers from any desired family or manufacturer.

The processor 712 of the illustrated example includes a local memory 713 (e.g., a cache). The processor 712 of the illustrated example is in communication with a main memory including a volatile memory 714 and a non-volatile memory 716 via a bus 718. The volatile memory 714 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 716 may be implemented by flash memory and/or any other desired type of memory device. Access to the main memory 714, 716 is controlled by a memory controller.

The processor platform 700 of the illustrated example also includes an interface circuit 720. The interface circuit 720 may be implemented by any type of interface standard, such as an Ethernet interface, a universal serial bus (USB), and/or a PCI express interface.

In the illustrated example, one or more input devices 722 are connected to the interface circuit 720. The input device(s) 722 permit(s) a user to enter data and commands into the processor 712. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 724 are also connected to the interface circuit 720 of the illustrated example. The output devices 724 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 720 of the illustrated example, thus, typically includes a graphics driver card, a graphics driver chip or a graphics driver processor.

The interface circuit 720 of the illustrated example also includes a communication device such as a transmitter, a receiver, a transceiver, a modem and/or network interface card to facilitate exchange of data with external machines (e.g., computing devices of any kind) via a network 726

(e.g., an Ethernet connection, a digital subscriber line (DSL), a telephone line, coaxial cable, a cellular telephone system, etc.).

The processor platform 700 of the illustrated example also includes one or more mass storage devices 728 for storing software and/or data. Examples of such mass storage devices 728 include floppy disk drives, hard drive disks, compact disk drives, Blu-ray disk drives, RAID systems, and digital versatile disk (DVD) drives.

The coded instructions 732 of FIG. 7 may be stored in the mass storage device 728, in the volatile memory 714, in the non-volatile memory 716, and/or on a removable tangible computer readable storage medium such as a CD or DVD.

From the foregoing, it will be appreciated that the above disclosed methods, systems, and apparatus provide for fabrication of droplet actuators via laser ablation and roll-to-roll processing to efficiently produce substrates that form the droplet actuators without comprising technical superiority of the electrodes associated with the droplet actuators. A base substrate is efficiently moved through stations via rollers without interruption to create electrode arrays, coat the arrays with a hydrophobic material, and cure the hydrophobic material to create a substrate that can serve as a structural support for a droplet disposed on the droplet actuator. Further, processing of the top substrate of the droplet actuator can be achieved using substantially the same roll-to-roll techniques, with additional customization as to whether, for example, the top substrate includes an electrode array. The roll-to-roll processing provides for individually wound rolls of the processed base substrate and top substrate that can be further diced and aligned to create individual droplet actuators. Alternatively, roll-to-roll processing may be further used to merge the base substrate and the top substrate to create a single roll that can be diced.

The examples disclosed herein utilize laser ablation to define electrode arrays on the substrates as the substrates are driven by the rollers. Laser ablation provides for electrode arrays having high performance qualities without impacting production speeds. By exposing successive portions of the substrates to a laser, the electrode patterns are created on the substrates in accordance with the rate at which the rollers advance the substrates. Low operational costs are achieved as a result of the thin layers of pre-adhered conductive and non-conductive materials to form the base substrate. Such a configuration reduces (1) material costs as compared to thick-film printing methods, and (2) the number of processing steps due to the pre-adhesion of the substrates prior to formation of the electrode patterns. The electrical conductivity, electrode inter-digitization, low surface and edge roughness, and high resolution, and small footprint of the electrode arrays achieved via laser ablation improves the precision of the droplet manipulation performed via resulting droplet actuator. Further, in substantially completely insulating the electrodes of the substrates, the example methods disclosed herein prevent unintended chemical changes or reactions to the droplet placed on the hydrophobic materials during manipulation of the droplet via electrical potentials.

Thus, the substrates are processed through the stations in a substantially implementation-ready state such that the processed substrates can be diced into discrete portions after the curing of the hydrophobic materials to create one or more droplet actuators. Such a reduction in processing the substrates improves production time and lowers costs without compromising the quality of the resulting droplet actuators.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. An apparatus comprising:
a non-conductive layer including a flexible plastic substrate;
a conductive layer adhered to the non-conductive layer;
a first set of electrodes associated with a first electrode pattern disposed in the conductive layer; and
a second set of electrodes associated with a second electrode pattern disposed in the conductive layer, the second set of electrodes defined by a plurality of iterative pulse markings including lines and a plurality of spacings, the spacings having a width of less than 10 micrometers, wherein the second electrode pattern is insulated by a hydrophobic layer and a dielectric layer and the first set of electrodes is not covered by the hydrophobic layer and the dielectric layer, and wherein at least a portion of the non-conductive layer comprises a disturbance proximate to the second electrode pattern, the first set of electrodes spaced apart from the second set of electrodes, the first set of electrodes at least partially surrounding the second set of electrodes and including a first row of electrodes extending proximate to a first side of the second electrode pattern and a second row of electrodes extending proximate to a second side of the second electrode pattern, the second set of electrodes including a third row of electrodes and a fourth row of electrodes, the third row of electrodes abutting the fourth row of electrodes, the third row of electrodes including at least one electrode extending therefrom perpendicular to the first row of electrodes and the fourth row of electrodes including at least one electrode extending therefrom perpendicular to the second row of electrodes.

2. The apparatus of claim 1, wherein the non-conductive layer further includes an outline of at least a portion of the second electrode pattern.

3. The apparatus of claim 1, wherein the disturbance includes a change in thickness in a surface of the portion of the non-conductive layer.

4. The apparatus of claim 1, further including an anti-fouling layer disposed on the second electrode pattern.

5. The apparatus of claim 1, wherein the non-conductive layer is a first non-conductive layer and further including a second non-conductive layer aligned with the first non-conductive layer and a gap defined between the first non-conductive layer and the second non-conductive layer.

6. The apparatus of claim 3, wherein the change in thickness includes a projection in the surface of the portion of the non-conductive layer or an indentation in the surface of the portion of the non-conductive layer.

7. The apparatus of claim 6, wherein the disturbance includes the indentation, the indentation including a sloped wall formed in the portion of the non-conductive layer.

8. The apparatus of claim 1, wherein the disturbance includes a discoloration of the non-conductive layer.

9. The apparatus of claim 1, wherein the second electrode pattern includes:
a first transverse row of electrodes that includes a first electrode from the third row of electrodes and a first electrode from the fourth row of electrodes; and a second transverse row of electrodes that includes a second electrode from the third row of electrodes and a second electrode from the fourth row of electrodes, the first transverse row of electrodes separated from the second transverse row of electrodes by a plurality of electrodes in the third row of electrodes and a plurality of electrodes in the fourth row of electrodes, the first transverse row of electrodes and the second transverse row of electrodes perpendicular to the first row of electrodes, the second row of electrodes, the third row of electrodes, and the fourth row of electrodes.

10. An apparatus comprising:

a first substrate comprising a flexible plastic layer and a metal layer, wherein the metal layer includes an electrode pattern, the electrode pattern including a first set of electrodes and a second set of electrodes, the first set of electrodes spaced apart from the second set of electrodes, the second set of electrodes including a first row of electrodes extending proximate to a first side of the first set of electrodes and a second row of electrodes extending proximate to a second side of the first set of electrodes, the first set of electrodes including a third row of electrodes and a fourth row of electrodes, the third row of electrodes abutting the fourth row of electrodes, the third row of electrodes including at least one electrode extending therefrom perpendicular to the first row of electrodes and the fourth row of electrodes including at least one electrode extending therefrom perpendicular to the second row of electrodes, the first set of electrodes insulated by a hydrophobic layer and a dielectric layer, the second set of electrodes not covered by the hydrophobic layer and the dielectric layer, wherein the electrode pattern is defined by a plurality of iterative pulse markings including lines having at least partially curved edges and spacings between the lines, the spacings having a width of less than 10 micrometers, at least a portion of the flexible plastic layer including a disturbance proximate to the electrode pattern;

a second substrate aligned with the first substrate; and a frame extending between the first substrate and the second substrate, the frame configured to form a gap between at least a portion of the first substrate and at least a portion of the second substrate, the frame extending between the first set of electrodes and the second set of electrodes on the first substrate.

11. The apparatus of claim 10, wherein the frame includes one or more projections at least partially disposed in the gap.

12. An apparatus comprising:

a first substrate including a plastic layer and a metal layer, wherein the metal layer includes an electrode pattern, the electrode pattern insulated by at least one of a hydrophobic or a dielectric material, wherein the electrode pattern includes lines having at least partially curved edges defining spacings between the lines, at least a portion of the plastic layer including a disturbance proximate to the electrode pattern;

a second substrate aligned with the first substrate, wherein the alignment includes a gap between the first substrate and the second substrate; and one or more projections at least partially disposed in the gap, wherein the projections include capillaries.

13. The apparatus of claim 10, wherein the second substrate includes at least one of a hydrophobic or a dielectric material.

14. The apparatus of claim 10, wherein the flexible plastic layer includes a partially curved groove corresponding to the electrode pattern formed in the metal layer.

15. The apparatus of claim 10, wherein the curved edges of the lines of the electrode pattern include a first curved feature resulting from a first laser pulse at least partially resembling a second curved feature resulting from a second laser pulse.

16. The apparatus of claim 10, wherein the frame includes a microstructure.

* * * * *